United States Patent
Igahara et al.

(10) Patent No.: US 11,355,197 B2
(45) Date of Patent: *Jun. 7, 2022

(54) MEMORY SYSTEM WITH NONVOLATILE CACHE AND CONTROL METHOD THEREOF

(71) Applicant: KIOXIA CORPORATION, Tokyo (JP)

(72) Inventors: Shunichi Igahara, Yokohama Kanagawa (JP); Toshikatsu Hida, Yokohama Kanagawa (JP)

(73) Assignee: KIOXIA CORPORATION, Tokyo (JP)

( * ) Notice: Subject to any disclaimer, the term of this patent is extended or adjusted under 35 U.S.C. 154(b) by 113 days.

This patent is subject to a terminal disclaimer.

(21) Appl. No.: 16/788,586

(22) Filed: Feb. 12, 2020

(65) Prior Publication Data

US 2020/0194075 A1 Jun. 18, 2020

Related U.S. Application Data

(63) Continuation of application No. 15/876,923, filed on Jan. 22, 2018, now Pat. No. 10,614,888.

(30) Foreign Application Priority Data

Jan. 25, 2017 (JP) .............................. JP2017-011590

(51) Int. Cl.
*G06F 12/00* (2006.01)
*G11C 16/10* (2006.01)
(Continued)

(52) U.S. Cl.
CPC ............ *G11C 16/105* (2013.01); *G06F 3/061* (2013.01); *G06F 3/0607* (2013.01);
(Continued)

(58) Field of Classification Search
CPC ... G11C 16/105; G11C 11/5628; G11C 16/10; G11C 16/3495; G11C 7/1096;
(Continued)

(56) References Cited

U.S. PATENT DOCUMENTS 8,990,458 B2 3/2015 Yano et al.
2009/0204746 A1* 8/2009 Chen .................... G06F 12/0246
711/103

(Continued)

OTHER PUBLICATIONS

Micron Technology, Inc., "1100 2.5-Inch and M.2 SATA NAND Flash SSD," Technical Data Sheet, 2015, 41 pages.

*Primary Examiner* — Tasnima Matin
(74) *Attorney, Agent, or Firm* — Kim & Stewart LLP

(57) ABSTRACT

A memory system includes a non-volatile memory having a plurality of memory cells, and a controller configured to carry out write operations in a first mode in which n-bit data is written per target memory cell of the non-volatile memory until an allowable data amount of data items has been written, and then, in a second mode in which m-bit data is written per target memory cell of the non-volatile memory, where n is an integer of one or more and m is an integer greater than n. The controller is further configured to detect that an idle state, in which a command has not been received from the host, has continued for a threshold period of time or more, increase the allowable data amount in response thereto, and after the increase, carry out a write operation to write data items in the non-volatile memory in the first mode.

20 Claims, 22 Drawing Sheets

(51) Int. Cl.
*G06F 3/06* (2006.01)
*G11C 7/10* (2006.01)
*G06F 12/02* (2006.01)
*G11C 16/08* (2006.01)
*G11C 11/56* (2006.01)
*G11C 16/34* (2006.01)

(52) U.S. Cl.
CPC .......... *G06F 3/0616* (2013.01); *G06F 3/0632* (2013.01); *G06F 3/0659* (2013.01); *G06F 3/0679* (2013.01); *G06F 12/0246* (2013.01); *G11C 7/1096* (2013.01); *G11C 11/5628* (2013.01); *G11C 16/08* (2013.01); *G11C 16/10* (2013.01); *G11C 16/3495* (2013.01); *G06F 2212/1036* (2013.01); *G06F 2212/7202* (2013.01); *G06F 2212/7211* (2013.01); *G11C 2207/2209* (2013.01); *G11C 2207/2245* (2013.01); *G11C 2211/5641* (2013.01)

(58) Field of Classification Search
CPC ............ G11C 16/08; G11C 2211/5641; G11C 2207/2245; G11C 2207/2209; G06F 3/0632; G06F 3/0607; G06F 12/0246; G06F 2212/1036
See application file for complete search history.

(56) References Cited

U.S. PATENT DOCUMENTS

| | | |
|---|---|---|
| 2009/0327590 A1 | 12/2009 | Moshayedi |
| 2011/0119430 A1* | 5/2011 | Lai ..................... G06F 12/0246 711/103 |
| 2011/0246705 A1 | 10/2011 | Mudama et al. |
| 2013/0159797 A1 | 6/2013 | Peng et al. |
| 2013/0297894 A1 | 11/2013 | Cohen et al. |
| 2016/0284393 A1* | 9/2016 | Ramalingam ....... G06F 12/0238 |
| 2017/0092366 A1 | 3/2017 | Hwang et al. |
| 2017/0228172 A1* | 8/2017 | Wu ....................... G06F 3/0679 |
| 2017/0329539 A1 | 11/2017 | Ko |
| 2018/0211708 A1 | 7/2018 | Igahara et al. |
| 2019/0065365 A1* | 2/2019 | Li ....................... G06F 12/0253 |

* cited by examiner

FIG. 7

| PARAMETER | DESCRIPTION |
|---|---|
| SLC BUFFER UNIT | DATA AMOUNT CORRESPONDING TO ONE SLC BUFFER UNIT |
| MINIMUM NUMBER OF SLC BUFFER UNITS | MINIMUM NUMBER OF ALLOCATED SLC BUFFER UNITS MINIMUM NUMBER OF SLC BUFFER UNITS IS EQUIVALENT TO DATA AMOUNT OF SLC BUFFER ALLOCATED IN INITIAL STATE (IMMEDIATELY AFTER SHIPMENT) OF SSD |
| MAXIMUM NUMBER OF SLC BUFFER UNITS | MAXIMUM VALUE OF NUMBER OF SLC BUFFER UNITS CAPABLE OF BEING ALLOCATED |
| INTERVAL TIME | THRESHOLD TIME FOR DETECTING IDLE STATE SLC BUFFER IS INCREASED BY ONE BUFFER UNIT WHEN PERIOD DURING WHICH COMMAND IS NOT RECEIVED FORM HOST REACHES THIS TIME |
| PROGRAM/ERASE CYCLE COUNT THRESHOLD | PROCESS OF INCREASING SLC BUFFER IS PERMITTED UNTIL NUMBER OF PROGRAM/ERASE CYCLES REACHES PROGRAM/ERASE CYCLE COUNT THRESHOLD |

US 11,355,197 B2

MEMORY SYSTEM WITH NONVOLATILE CACHE AND CONTROL METHOD THEREOF

CROSS-REFERENCE TO RELATED APPLICATION

This application is a continuation of U.S. patent application Ser. No. 15/876,923, filed Jan. 22, 2018, which application is based upon and claims the benefit of priority from Japanese Patent Application No. 2017-011590, filed Jan. 25, 2017, the entire contents of which are incorporated herein by reference.

FIELD

Embodiments described herein relate generally to a memory system including a non-volatile memory and a control method thereof.

BACKGROUND

In recent years, memory systems implementing non-volatile memory are widely used.

As one of such memory systems, solid-state drives (SSDs) implementing NAND flash memory are known. The SSDs are used as the main storage for various computing devices.

In a non-volatile memory such as the NAND flash memory, the number of program/erase cycles is limited. When the number of executed program/erase cycles reaches a limit value, a failure occurs in the non-volatile memory.

In the non-volatile memory, as the number of bits stored in each memory cell becomes larger, the capacity of the memory cell becomes larger. In addition, the time necessary to write data items in the non-volatile memory and the time necessary to read data items from the non-volatile memory become longer.

In recent years, a memory system capable of writing data items in the non-volatile memory by selectively using a single-level cell (SLC) mode and a multi-level cell (MLC) mode has been developed.

DESCRIPTION OF THE DRAWINGS

FIG. 7 is a diagram showing an example a write operation control parameter set applied to the memory system according to the present embodiment.

DETAILED DESCRIPTION

In the embodiments, the data items are written in the non-volatile memory selectively in the SLC mode, and thus, it is possible to improve write performance (e.g., write speed) and read performance (e.g., read speed) relative to memory systems writing exclusively in the MLC mode.

However, when the SLC mode is used, the amount of data items capable of being stored in one block within the non-volatile memory is smaller than that in a case where the MLC mode is used exclusively.

Accordingly, when the SLC mode is used, a write/erase operation for each block is performed with a higher frequency than in a case where the MLC mode is used, and thus, it tends to increase the number of program/erase cycles.

As stated above, since the non-volatile memory has a limited number of program/erase cycles, a rise in the number of program/erase cycles causes a decrease of total byte written (TBW) which is an index indicating the total amount of data items capable of being written during the lifespan of the memory system, and thus, the lifespan of the memory system may be shortened.

Accordingly, embodiments provide a memory system and a control method capable of maintaining the balance between lifespan and performance.

In general, according to one embodiment, a memory system capable of being connected to a host includes a non-volatile memory, and a controller that is electrically connected to the non-volatile memory, and is configured to carry out write operations, in response to write commands received from a host, in a first mode in which n-bit data is written per target memory cell of the non-volatile memory until an allowable data amount of data items has been written, and then, in a second mode in which m-bit data is written per target memory cell of the non-volatile memory, where n is an integer of one or more and m is an integer greater than n. The controller is further configured to detect that an idle state, in which a command has not been received from the host, has continued for a threshold period of time or more, increase the allowable data amount by a first data amount in response to the detection that the idle state has continued for the threshold period of time or more, and after the increase, carry out a write operation to write data items in the non-volatile memory in the first mode in response to a write command received from the host.

Hereinafter, embodiments will be described with reference to the drawings.

Figure 1:
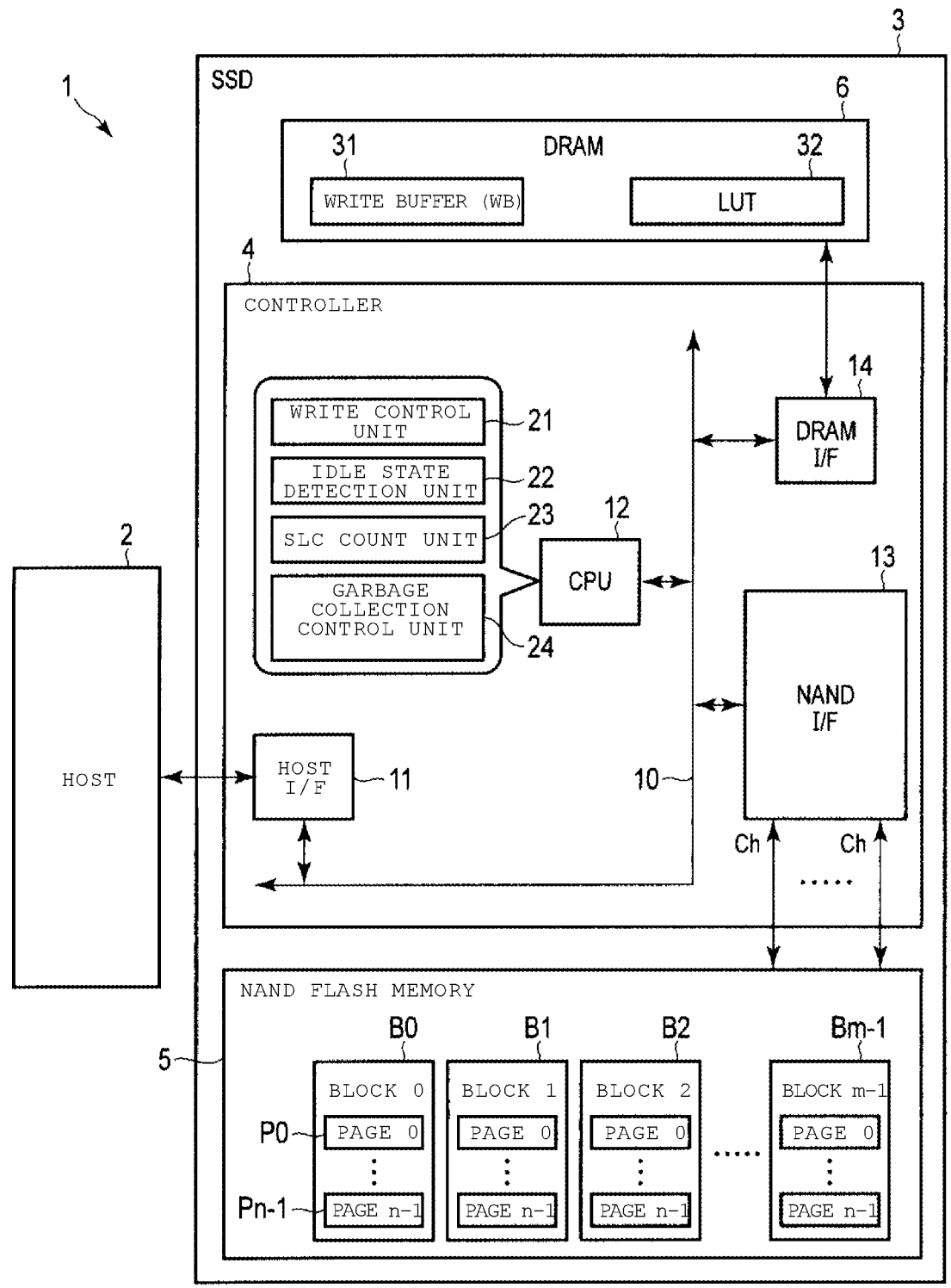
FIG. 1 is a block diagram showing a configuration example of a memory system according to an embodiment.

Initially, a configuration of an information processing system 1 including a memory system according to an embodiment will be described with reference to FIG. 1.

The memory system is a semiconductor storage device that is configured to write data in a non-volatile memory and read data from the non-volatile memory. For example, the memory system is realized as a solid-state drive (SSD) 3 including NAND flash memory.

The information processing system 1 includes a host 2, and the SSD 3. The host 2 is an information processing device (e.g., computing device) that accesses the SSD 3. The host 2 may be a server (e.g., storage server) that stores various data items in the SSD 3, or may be a personal computer.

The SSD 3 may be used as a main storage of the information processing device functioning as the host 2. The SSD 3 may be built in the information processing device, or may be connected to the information processing device through a cable or a network.

SCSI, Serial Attached SCSI (SAS), ATA, Serial ATA (SATA), PCI Express (PCIe®) (registered trademark), Ethernet (registered trademark), Fibre Channel, or NVM Express (NVMe) (registered trademark) may be adopted as an interface for mutually connecting the host 2 and the SSD 3.

The SSD 3 includes a controller 4, and a non-volatile memory (e.g., NAND flash memory) 5. The SSD 3 may include a random-access memory, for example, a DRAM 6. Alternatively, a random-access memory such as an SRAM may be built in the controller 4.

The NAND flash memory 5 may include a plurality of NAND flash memory chips (also referred to as NAND flash memory dies). Each chip is capable of being used as a multi-level cell (MLC) flash memory configured to store a plurality of bits per memory cell.

Examples of the MLC flash memory include a 4-level-MLC flash memory capable of storing 2-bit data per memory cell, an 8-level-MLC flash memory (triple level cell (TLC)) capable of storing 3-bit data per memory cell, and a 16-level-MLC (quadruple level cell (QLC)) flash memory capable of storing 4-bit data per memory cell.

The NAND flash memory 5 includes a memory cell array including a plurality of memory cells arranged in a matrix configuration. The NAND flash memory 5 may be a two-dimensional NAND flash memory, or may be a three-dimensional NAND flash memory.

The memory cell array of the NAND flash memory 5 includes a plurality of blocks B0 to Bm−1. Each of the blocks B0 to Bm−1 includes a plurality of pages (page P0 to Pn−1 in this example). The block unit is a minimum erase unit. The blocks are also referred to as "erase blocks" or are simply referred to as "physical blocks". Each of pages P0 to Pn−1 includes a plurality of memory cells connected to a word line. Each of the pages P0 to Pn−1 is a unit on which a data write operation and a data read operation is performed.

The NAND flash memory 5 may perform the write operation in any one of a single-level cell (SLC) mode in which one bit is written per memory cell and a multi-level cell (MLC) mode in which a plurality of bits is written per memory cell.

For example, the NAND flash memory 5 may be realized as a 4-level-MLC flash memory capable of storing two bits per memory cell.

In this case, as many as two pages (e.g., lower page and upper page) are typically written in a plurality of memory cells connected to the same word line. Accordingly, two bits are written per memory cell. However, any area (for example, any of one or more blocks) within the 4-level-MLC flash memory may be used as an SLC area designated to store only one bit per memory cell.

In the write operation for writing data in the SLC area, no more than one page is written in the plurality of memory cells connected to the same word line. Accordingly, only one bit is written per memory cell in each block used as the SLC area, similarly to a block within SLC flash memory. As a result, each block used as the SLC area functions as a pseudo SLC block.

Alternatively, the NAND flash memory 5 may be an 8-level-MLC flash memory (triple-level cell (TLC) flash memory) capable of storing three bits per memory cell.

In this case, as many as three pages (e.g., lower page, middle page, and upper page) are written in the plurality of memory cells connected to the same word line. Accordingly, three bits are written per memory cell. However, any area (for example, any of one or more blocks) within the TLC flash memory may be used as the SLC area, or may be used as the 4-level-MLC area capable of storing two bits per memory cell. In the 4-level-MLC area, only two pages are written in the plurality of memory cells connected to the same word line. Accordingly, only two bits are written per memory cell in the 4-level-MLC area.

Alternatively, the NAND flash memory 5 may be a 16-level-MLC flash memory (quadruple-level cell (QLC) flash memory) capable of storing four bits per memory cell.

In this case, as many as four pages are written in the plurality of memory cells connected to the same word line.

Accordingly, four bits are written per memory cell. However, any area (for example, any of one or more blocks) within the QLC flash memory may be used as the SLC area, may be used as the 4-level-MLC area, or may be used as the 8-level-MLC area capable of storing three bits per memory cell. In the 8-level-MLC area, only three pages are written in the plurality of memory cells connected to the same word line. Accordingly, three bits are written per memory cell in the 8-level-MLC area.

The NAND flash memory 5 may be configured to store five bits or more per memory cell. In this case, any area in the NAND flash memory 5 may be used as an area in which only data of four bits or less are written per memory cell.

Each of the blocks B0 to Bm−1 has a limited number of program/erase cycles. One program/erase cycle of a certain block includes an erasing operation for setting all the memory cells within the block to be in an erased state, and a write operation (which includes a program operation) for writing data items in the pages of this block.

The controller 4 is electrically connected to the NAND flash memory 5 which is the non-volatile memory through a NAND interface 13 such as Toggle or Open NAND Flash Interface (ONFI). The NAND interface 13 functions as a NAND control circuit configured to control the NAND flash memory 5. The NAND interface 13 may be connected to the plurality of chips within the NAND flash memory 5 through the plurality of channels.

The controller 4 functions as a memory controller configured to control the NAND flash memory 5.

The controller 4 also functions as a flash translation layer (FTL) configured to perform the data management and block management of the NAND flash memory 5. The data management performed by the FTL includes (1) a management of mapping information indicating a correspondence between the logical addresses and the physical addresses of the NAND flash memory 5, and (2) a process for concealing the read/write operation on the page basis and the erasing operation based on the block basis. The logical address is an address used by the host 2 in order to designate the address of the SSD 3. The logical block address (LBA) is typically used as the logical address.

The management of the mapping of the logical block addresses (LBAs) and the physical addresses is performed by using a lookup table (LUT) 32 functioning as an address translation table (in particular, logical-to-physical address translation table). The controller 4 manages the mapping of the LBAs and the physical addresses based on a predetermined management size unit by using the LUT 32. A physical address corresponding to a certain LBA indicates a physical storage position within the NAND flash memory 5 in which the data related to the LBA is written. The address translation table (e.g., LUT 32) may be loaded to the DRAM 6 from the NAND flash memory 5 when the SSD 3 is powered on.

The data writing for the page may be performed only one time per one program/erase cycle. Thus, the controller 4 writes update data corresponding to a certain LBA in a different physical storage position other than a physical storage position in which previous data corresponding to the LBA is stored. Then the controller 4 updates the LUT 32 to associate this LBA with the different physical storage position and invalidate the previous data.

The block management includes the management of bad blocks, wear leveling, and garbage collection.

The controller 4 may include a host interface 11, a CPU 12, the NAND interface 13, and a DRAM interface 14. The CPU 12, the NAND interface 13, and the DRAM interface 14 may be connected to each other through a bus 10.

The host interface 11 receives various commands, for example, I/O commands (e.g., a write command and a read command), and various control commands from the host 2.

The CPU 12 is a processor configured to control the host interface 11, the NAND interface 13, and the DRAM interface 14. The CPU 12 performs various processes by executing a control program (e.g., firmware) stored in a ROM (not shown). The CPU 12 may perform a command process for processing various commands from the host 2 in addition to the FTL process. An operation of the CPU 12 is controlled by the firmware executed by the CPU 12. Apart or all of the FTL process and the command process may be performed by dedicated hardware within the controller 4.

The CPU 12 under control of the firmware functions as the write control unit 21, an idle state detection unit 22, an SLC count unit 23, and a garbage collection control unit 24.

The write control unit 21 adaptively controls a write mode for writing data received from the host 2 to the NAND flash memory 5 in order to improve the performance of the SSD 3 as much as possible without causing a decrease in lifespan of the SSD 3. That is, the write control unit 21 is configured to dynamically switch the write mode between a first mode in which n-bit data is written per memory cell and a second mode in which m-bit data is written per memory cell. In this example, n is an integer of one or more, and m is an integer greater than n.

The first mode is a performance-oriented write mode for improving the write performance and read performance of the SSD 3 by decreasing the number of bits capable of being stored per memory cell. The second mode is a lifespan-oriented write mode capable of further increasing the TBW than in a case where the first mode is used, by increasing the number of bits capable of being stored per memory cell.

Examples of the combination of the first mode and the second mode are as follows.

Combination #1: the SLC mode in which one bit is written per memory cell is used as the first mode, and the MLC mode in which the plurality of bits is written per memory cell is used as the second mode. The MLC mode may be the 4-level-MLC mode in which two bits are written per memory cell, may be the 8-level-MLC mode (TLC mode) in which three bits are written per memory cell, or may be the 16-level-MLC mode (QLC mode) in which four bits are written per memory cell.

Combination #2: The 4-level-MLC mode is used as the first mode, and the 8-level-MLC mode (TLC mode) or the 16-level-MLC mode (QLC mode) is used as the second mode.

Combination #3: the 8-level-MLC mode (TLC mode) is used as the first mode, and the 16-level-MLC mode (QLC mode) is used as the second mode.

Hereinafter, a process of dynamically switching the write mode in a case where the combination #1 (the SLC mode in which one bit is written per memory cell or the MLC mode in which the plurality of bits is written per memory cell) is used will be described.

When the SSD 3 is initially powered on after the factory shipment of the SSD 3, the write control unit 21 selects the SLC mode as the write mode. The write control unit 21 writes data items received from the host 2 to the NAND flash memory 5 in the SLC mode until the amount of data items written in the NAND flash memory 5 reaches an allowable data amount indicating the amount of data items capable of being written in the SLC mode. The allowable data amount is a preset data amount. For example, one percentage or a few percentages of the capacity of the NAND flash memory 5 may be previously set as the allowable data amount.

For a period from when the SSD 3 is initially powered on after the factory shipment to when data items corresponding to the allowable data amount are written in the SSD 3 by the host 2, the data items from the host 2 are written in the NAND flash memory 5 in the SLC mode at a high speed.

For a period during which the write mode is the SLC mode, the data items received from the host 2 are written in the storage area within the NAND flash memory 5 allocated as the SLC area (referred to as an SLC buffer). A minimum unit of the storage area capable of being allocated as the SLC area is referred to as an SLC buffer unit. The number of blocks constituting one SLC buffer unit may be one or any number, which is two or more. Alternatively, the number of blocks constituting one SLC buffer unit may be equal to the number of flash memory chips capable of being operated in parallel.

The page may be used as the SLC buffer unit. Alternatively, when one block is configured with several sub-blocks, one sub-block may be used as the SLC buffer unit.

In the following description, it is assumed that the SLC buffer unit is configured with one or more blocks. The allowable data amount is designated by the number of SLC buffer units. Hereinafter, the block used for writing the data in the SLC mode is referred to as an "SLC buffer block" or an "SLC block", and the block used for writing the data in the MLC mode is referred to as an "MLC block".

For a period during which the write mode is the SLC mode, the data items received from the host 2 are written in the SLC area, that is, one or more blocks within the NAND flash memory 5 allocated as the SLC buffer block. In other words, the write control unit 21 writes the data items to the NAND flash memory 5 in the SLC mode in response to a write command received from the host 2.

When the amount of data items written in the NAND flash memory 5 in the SLC mode reaches the allowable data amount, the write control unit 21 changes the write mode to the MLC mode. The write control unit 21 writes the data items to the NAND flash memory 5 in the MLC mode in response to a write command received from the host 2. For a period during which the write mode is the MLC mode, the data items received from the host 2 are written in the MLC area, that is, one or more blocks within the NAND flash memory 5 allocated as the MLC block.

Accordingly, the data items received after the allowable data amount is exceeded, are basically written in the NAND flash memory 5 in the MLC mode.

For example, the allowable data amount is 30 MB, and when the write operation for 90 MB of data items is requested by several write commands received from the host 2, 30 MB of initial data items are written in the NAND flash memory 5 in the SLC mode. Sixty MB of subsequent data items are written in the NAND flash memory 5 in the MLC mode.

In this example, it is assumed that the amount of data items capable of being written in the MLC mode per block is 20 MB and the amount of data items capable of being written in the SLC mode per block is 10 MB.

In this case, 30 MB of initial data items are written in three SLC buffer blocks in the SLC mode, and 60 MB of subsequent data items are written in three MLC blocks in the MLC mode.

As stated above, for a period during which it is necessary to consecutively perform the write operation, that is, for a period during which the amount of data items to be written is large, the write operation is performed in the MLC mode.

A rise in total number of program/erase cycles for a period during which the write operation is performed in the MLC mode may be further suppressed than in a case where the write operation is performed exclusively in the SLC mode. The total number of program/erase cycles is the total number of program/erase cycles performed in the NAND flash memory 5, that is, a total value of the number of program/erase cycles for all the blocks within the NAND flash memory 5.

Thereafter, the write control unit 21 increases the allowable data amount by a certain data amount in order to return the write mode immediately to the SLC mode after an idle state in response to the detection of the idle state. In this example, the idle state means a state in which a command is not received from the host 2 for a period of a threshold time or more. In other words, the idle state is an idle state of the host interface 11.

The write control unit 21 writes the data items to the NAND flash memory 5 in the SLC mode in response to a write command received from the host 2 after the idle state is detected until the amount of data items written in the NAND flash memory 5 in the SLC mode reaches the added (increased) data amount after the idle state is detected.

As mentioned above, when the idle state is detected, the write control unit 21 determines that a current period is a period during which it is not necessary to consecutively perform the write operation, that is, the current period is a period during which the amount of data items to be written is not large. In such a period, even though the SLC mode is used, the total number of program/erase cycles does not remarkably increase for a short time. Accordingly, the write mode immediately after the idle state is returned to the SLC mode from the MLC mode, and thus, it is possible to temporarily improve the write performance immediately after the idle state without causing a remarkable rise in the total number of program/erase cycles. The amount of data items capable of being written in the SLC mode immediately after the idle state is restricted up to the added data amount. Accordingly, it is possible to restrict the number of SLC buffer blocks capable of being used for writing the data items up to the number of blocks corresponding to the added data amount even though the amount of write data items starts to increase, and thus, it is possible to prevent a significant rise in the total number of program/erase cycles.

The SLC count unit 23 counts a value (e.g., available SLC buffer block counter value) indicating the number of SLC buffer units capable of being currently used. When the allowable data amount is increased by the amount of data items corresponding to one SLC buffer unit, the SLC count unit 23 increases the available SLC buffer block counter value by one. When one or more SLC buffer blocks corresponding to one SLC buffer unit are allocated as writing destination blocks, and the data are written in these SLC buffer blocks, the SLC count unit 23 decreases the available SLC buffer block counter value by one.

The garbage collection control unit 24 performs the garbage collection in order to increase the number of free blocks in which the data items can be written. In the garbage collection, the garbage collection control unit 24 executes an operation for copying valid data items within several blocks which retain valid data items and invalid data items together to different blocks (for example, free blocks). In this example, the valid data means data which is most current data associated with a logical address referred to in the LUT 32. To sum, data associated with a certain LBA is valid data, and data which is not associated with any LBA is invalid data. The garbage collection control unit 24 updates the LUT 32, and maps the LBAs of the copied valid data items to the new physical addresses of the copying destinations. The valid data items are copied to different blocks, and thus, the blocks in which only invalid data items are present are released as the free blocks which do not include valid data items. This block may be reused after the erasing operation is performed.

Figure 2:
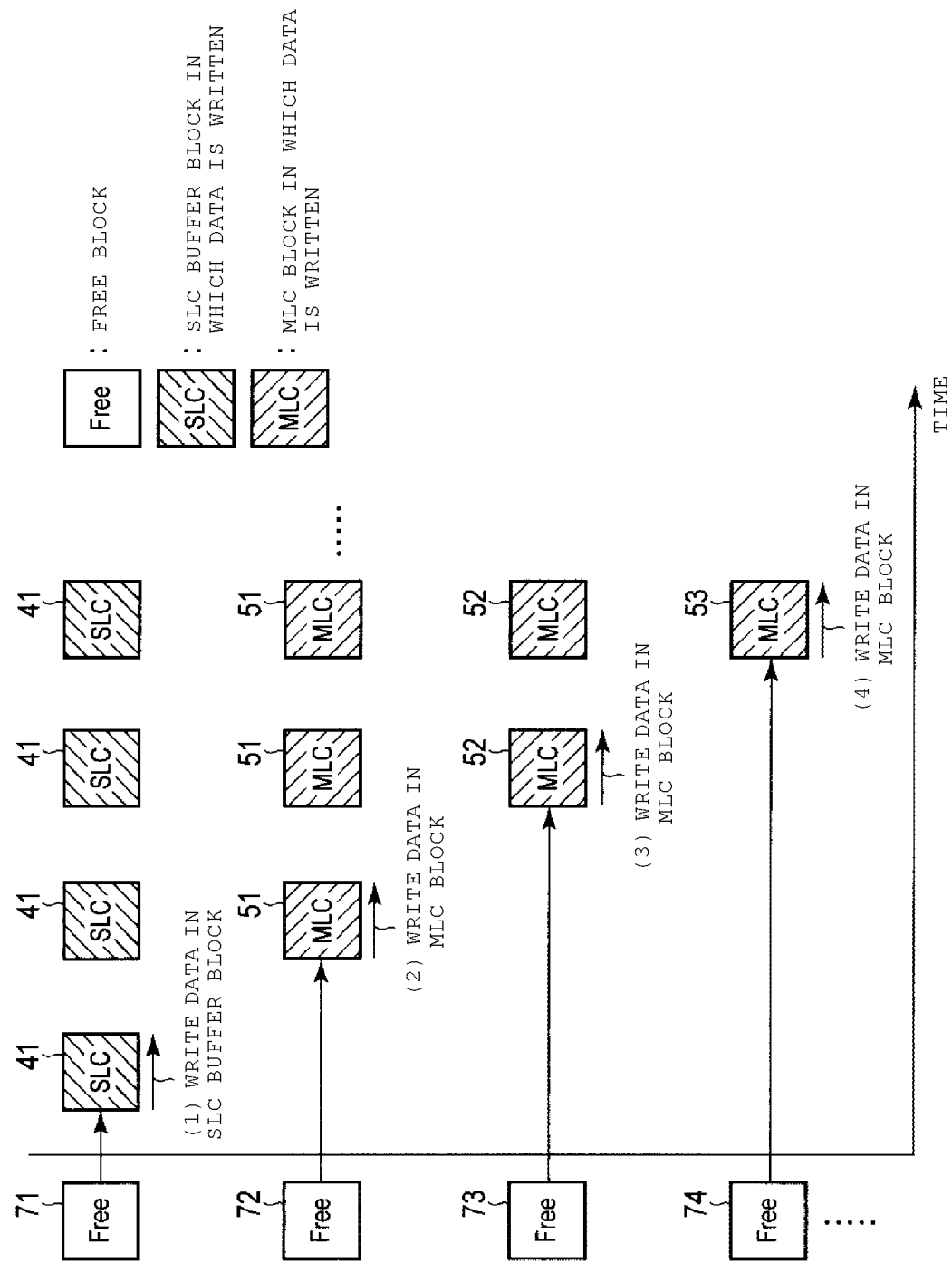
FIG. 2 is a diagram showing an example of a write operation performed by the memory system according to the present embodiment when an idle state is not detected.

FIG. 2 shows an example of the write operation performed by the controller 4 of the SSD 3 when the idle state is not detected.

In this example, it is assumed that the allowable data amount is the amount of data items corresponding to one SLC buffer unit (i.e., one SLC buffer block) for simplicity of illustration.

(1) Initially, the write control unit 21 selects the SLC mode as the write mode. The write control unit 21 allocates a free block 71 as a writing destination block for the SLC mode (depicted as SLC buffer block 41), and writes data items received from the host 2 in the SLC buffer block 41 in the SLC mode.

(2) When the SLC buffer block 41 is filled with the data items, that is, when the data items corresponding to the allowable data amount are written in the SLC mode, the write control unit 21 changes the write mode to the MLC mode. The write control unit 21 allocates a next free block 72 as a writing destination block for the MLC mode (depicted as MLC block 51), and writes data items received from the host 2 in the MLC block 51 in the MLC mode.

(3) When the MLC block 51 is filled with the data items, the write control unit 21 allocates a next free block 73 as a writing destination block for the MLC mode (depicted as MLC block 52), and writes data items received from the host 2 in the MLC block 52 in the MLC mode.

(4) When the MLC block 52 is filled with the data items, the write control unit 21 allocates a next free block 74 as a writing destination block for the MLC mode (depicted as MLC block 53), and writes data items received from the host 2 in the MLC block 53 in the MLC mode.

Figure 3:
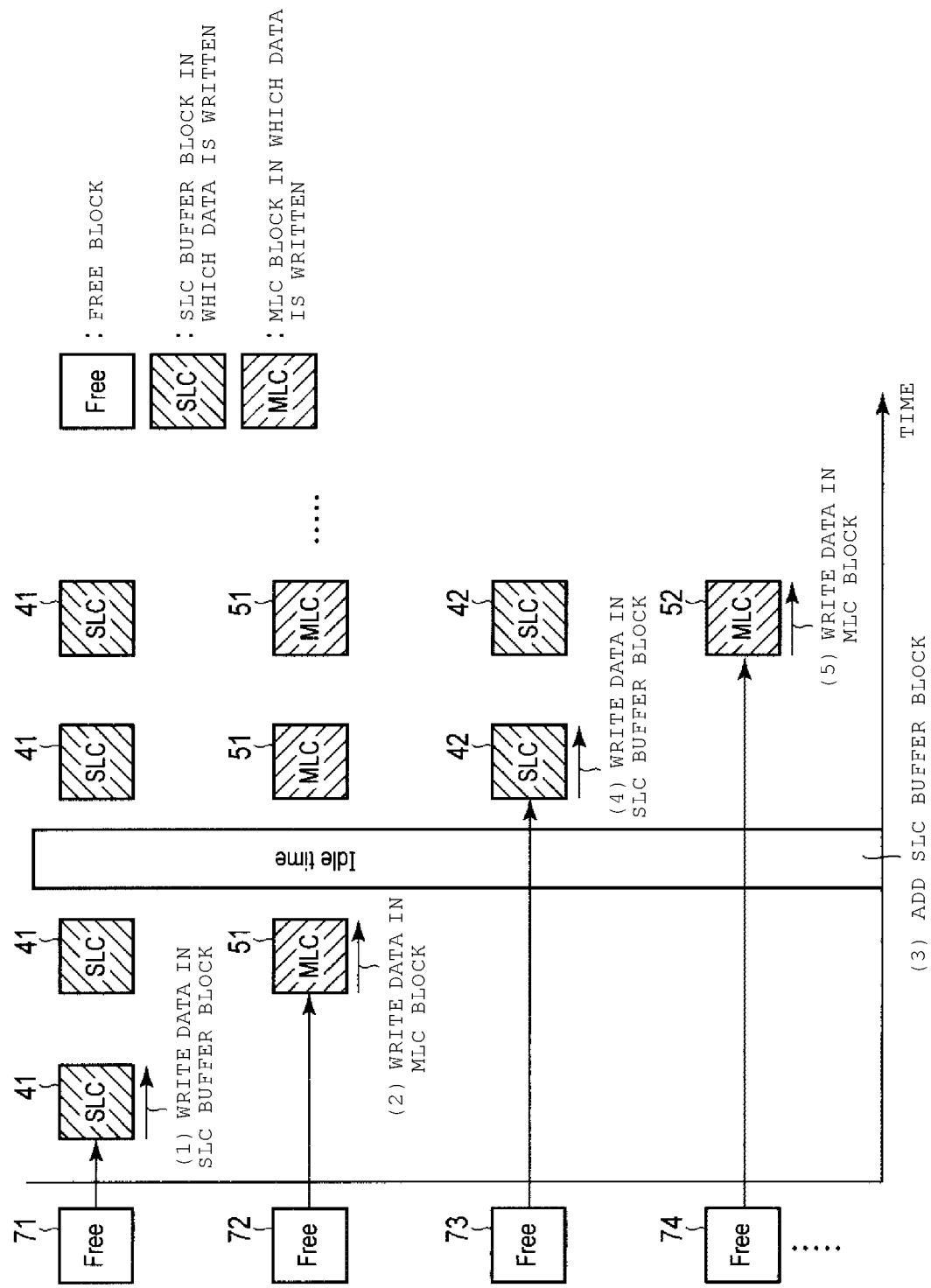
FIG. 3 is a diagram showing an example of write operations performed by the memory system according to the present embodiment with idle states existing therebetween.

FIG. 3 shows an example of the write operations performed by the controller 4 with idle states existing therebetween.

(1) Initially, the write control unit 21 selects the SLC mode as the write mode. The write control unit 21 allocates a free block 71 as a writing destination block for the SLC mode (depicted as SLC buffer block 41), and writes the data items received from the host 2 in the SLC buffer block 41 in the SLC mode.

(2) When the SLC buffer block 41 is filled with the data items, that is, when the data items corresponding to the allowable data amount are written in the SLC mode, the write control unit 21 changes the write mode to the MLC mode. The write control unit 21 allocates a next free block 72 as a writing destination block for the MLC mode (depicted as MLC block 51), and writes data items received from the host 2 in the MLC block 51 in the MLC mode.

(3) When the idle state is detected by the idle state detection unit 22, the write control unit 21 adds the allowable data amount by the amount of data items corresponding to one SLC buffer unit (in this example, the amount of data items corresponding to one SLC buffer block), and returns the write mode to the SLC mode. Accordingly, since the allowable data amount is increased by the amount of data items corresponding to one SLC buffer block, it is possible to use another free block as the SLC buffer block. In this case, one free block is added as the block capable of being allocated as the SLC buffer block.

(4) The write control unit 21 allocates a next free block 73 as a writing destination block for the SLC mode (depicted as SLC buffer block 42), and writes data items received from the host 2 in the SLC buffer block 42 in the SLC mode after the idle state is detected. The free block 73 is equivalent to the block added as the block capable of being allocated as an SLC buffer block in (3).

(5) When the SLC buffer block 42 is filled with the data items, that is, when the amount of data items written in the SLC mode after the idle state is detected reaches the amount of data items corresponding to one SLC buffer block after the idle state is detected, the write control unit 21 changes the write mode to the MLC mode again. The write control unit 21 allocates a next free block 74 as a writing destination block for the MLC mode (depicted as MLC block 52), and writes data items received from the host 2 in the MLC block 52 in the MLC mode.

Figure 4:
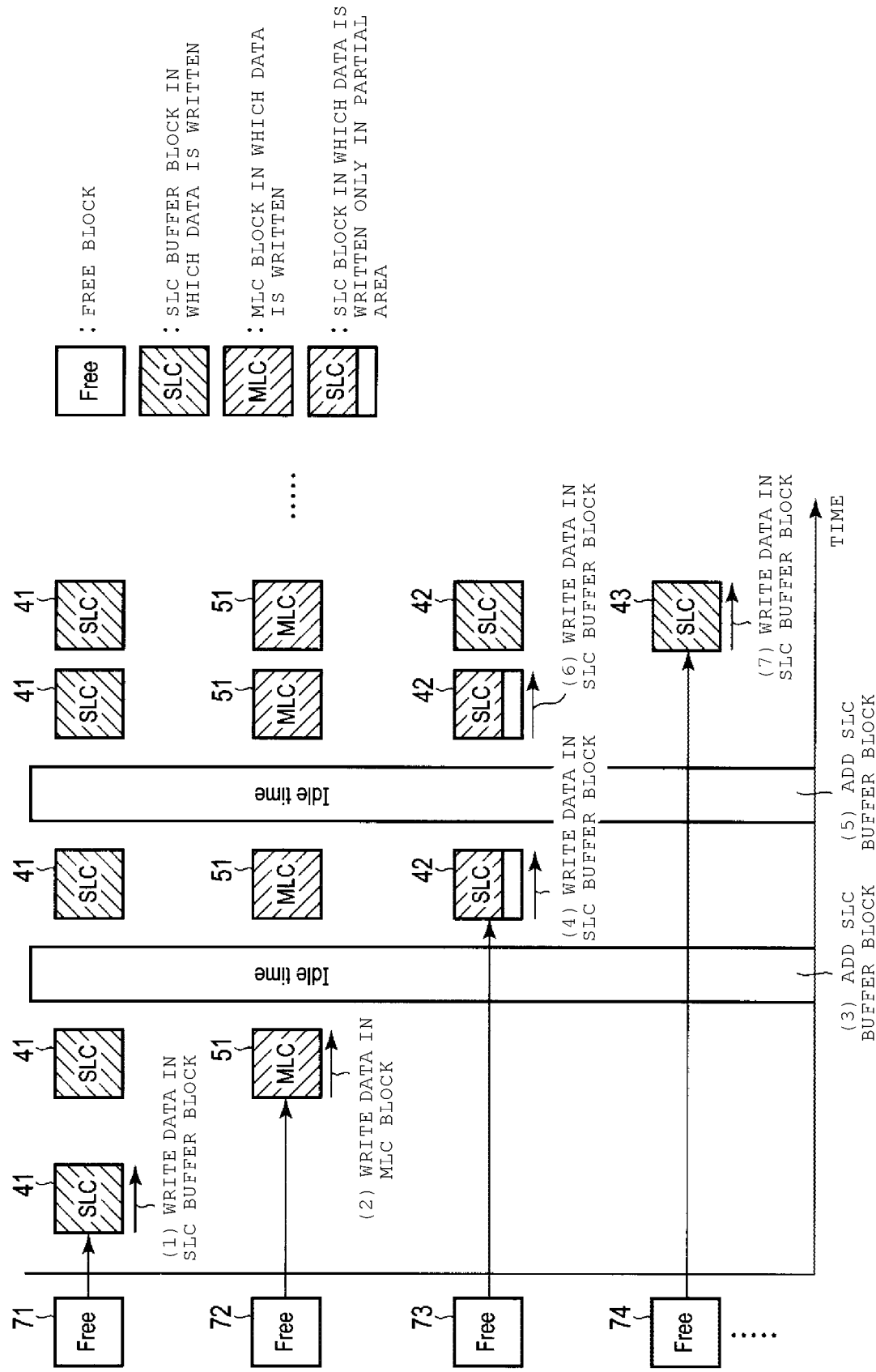
FIG. 4 is a diagram showing another example of the write operations performed by the memory system according to the present embodiment with the idle states existing therebetween.

FIG. 4 shows still another example of the write operations performed by the controller 4 with idle states existing therebetween.

(1) Initially, the write control unit 21 selects the SLC mode as the write mode. The write control unit 21 allocates a free block 71 as a writing destination block for the SLC mode (depicted as SLC buffer block 41), and writes the data items received from the host 2 in the SLC buffer block 41 in the SLC mode.

(2) When the SLC buffer block 41 is filled with the data items, that is, when the data items corresponding to the allowable data amount are written in the SLC mode, the write control unit 21 changes the write mode to the MLC mode. The write control unit 21 allocates a next free block 72 as a writing destination block for the MLC mode (depicted as MLC block 51), and writes data items received from the host 2 in the MLC block 51 in the MLC mode.

(3) When the idle state is detected by the idle state detection unit 22, the write control unit 21 adds the allowable data amount by the amount of data items corresponding to one SLC buffer unit (in this example, the amount of data items corresponding to one SLC buffer block), and returns the write mode to the SLC mode.

(4) The write control unit 21 allocates a next free block 73 as a writing destination block for the SLC mode (depicted as SLC buffer block 42), and writes data items received from the host 2 in the SLC buffer block 42 in the SLC mode after the idle state is detected.

(5) When the idle state is detected again by the idle state detection unit 22 before the SLC buffer block 42 is filled with the data items, the write control unit 21 adds the allowable data amount by the amount of data items corresponding to one SLC buffer unit again (in this example, the amount of data items corresponding to one SLC buffer block), and maintains the write mode in the SLC mode. Accordingly, since the allowable data amount is increased by the amount of data items corresponding to one SLC buffer block again, it is possible to use still another free block as the SLC buffer block. In this case, one free block is added as the block capable of being allocated as the SLC buffer block.

The allowable data amount may not be increased by the amount of data items corresponding to the one entire buffer block, and the allowable data amount may be added by the amount of remaining data items (that is, if the SLC buffer unit is not full) acquired by subtracting an empty area of the SLC buffer block 42 from the amount of data items corresponding to one buffer block. The empty area of the SLC buffer block 42 is an available area within the SLC buffer block 42 in which the data items are not written yet.

(6) The write control unit 21 writes data items received from the host 2 after the second idle state is detected in the empty area of the SLC buffer block 42 in the SLC mode.

(7) When the SLC buffer block 42 is filled with the data items, the write control unit 21 allocates a next free block 74 as the writing destination block for the SLC mode (depicted as SLC buffer block 43). The free block 74 is equivalent to the block added as the block capable of being allocated as the SLC buffer block in (5). The write control unit 21 writes data items received from the host 2 in the SLC buffer block 43 in the SLC mode. The data items received from the host 2 after the second idle state is detected may be initially written in the SLC buffer block 43 in the SLC mode, and the subsequent data items may be written in the empty area of the SLC buffer block 42 in the SLC mode after the SLC buffer block 43 is filled with the data items.

Figure 5:
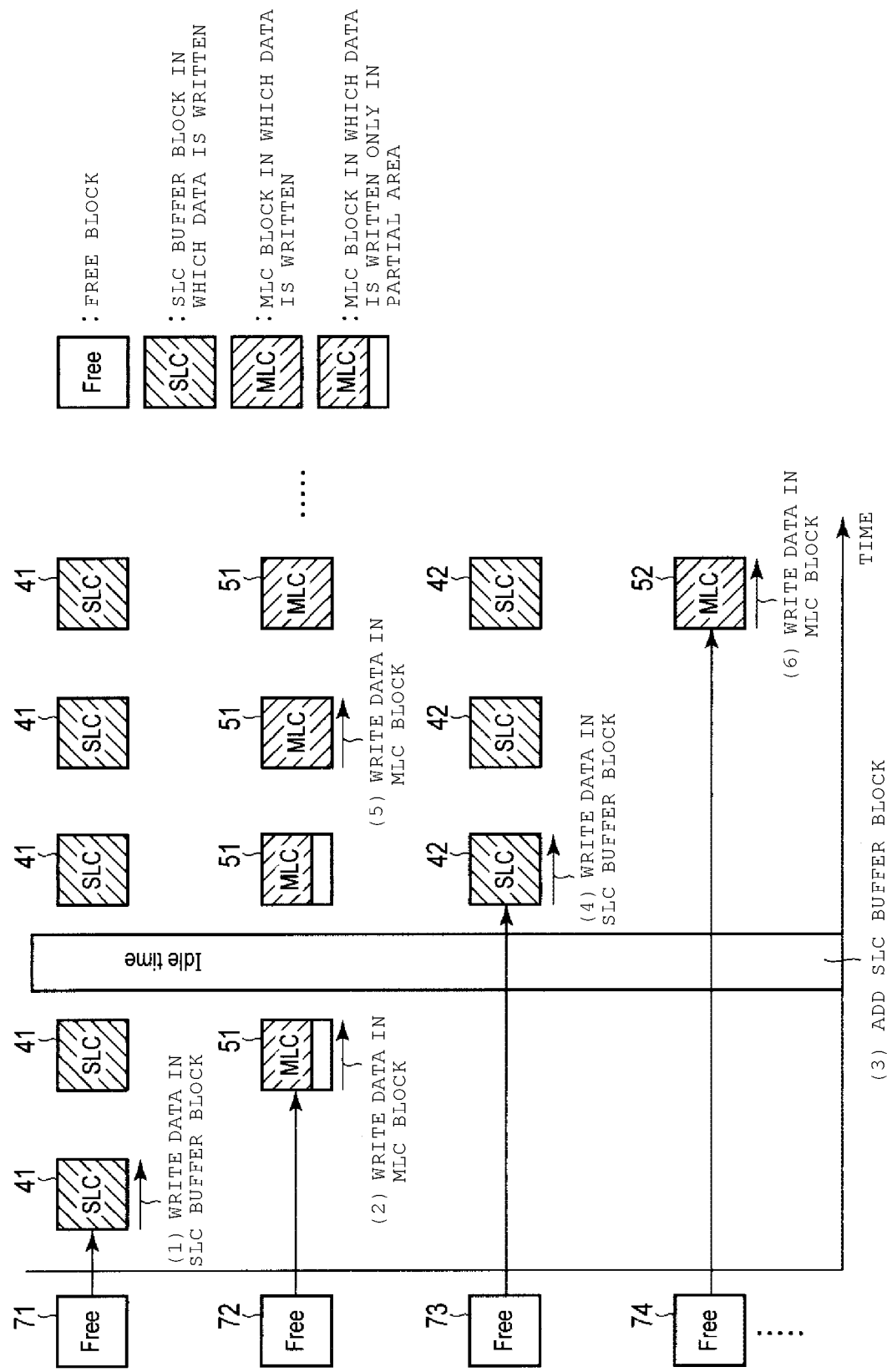
FIG. 5 is a diagram showing still another example of the write operations performed by the memory system according to the present embodiment with the idle states existing therebetween.

FIG. 5 shows still another example of the write operations performed by the controller 4 with idle states existing therebetween.

(1) Initially, the write control unit 21 selects the SLC mode as the write mode. The write control unit 21 allocates a free block 71 as a writing destination block for the SLC mode (depicted as SLC buffer block 41), and writes the data items received from the host 2 in the SLC buffer block 41 in the SLC mode.

(2) When the SLC buffer block 41 is filled with the data items, that is, when the data items corresponding to the allowable data amount are written in the SLC mode, the write control unit 21 changes the write mode to the MLC mode. The write control unit 21 allocates a next free block 72 as a writing destination block for the MLC mode (depicted as MLC block 51), and writes data items received from the host 2 in the MLC block 51 in the MLC mode.

(3) When the idle state is detected by the idle state detection unit 22 before the MLC block 51 is filled with the data items, the write control unit 21 initially adds the allowable data amount by the amount of data items corresponding to one SLC buffer unit (in this example, the amount of data items corresponding to one SLC buffer block), and returns the write mode to the SLC mode. Accordingly, since the allowable data amount is increased by the amount of data items corresponding to one SLC buffer block again, it is possible to use another free block as the SLC buffer block. In this case, one free block may be added as the block capable of being allocated as the SLC buffer block. (4) The write control unit 21 allocates a next free block 73 as a writing destination block for the SLC mode (depicted as SLC buffer block 42), and writes data items received from the host 2 in the SLC buffer block 42 in the SLC mode after the idle state is detected. The free block 73 is equivalent to the block added as the block capable of being allocated as the SLC buffer block in (3).

(5) When the SLC buffer block 42 is filled with the data items, that is, when the amount of data items written in the SLC mode after the idle state is detected reaches the amount of data items corresponding to one SLC buffer block after the idle state is detected, the write control unit 21 changes the write mode to the MLC mode again. The write control unit 21 writes data items received from the host 2 in the empty area of the MLC block 51 in the MLC mode. The empty area of the MLC block 51 is an available area in which the data is not written yet.

The data may be initially written in the empty area of the MLC block 51, or the subsequent data items may be written in the SLC buffer block 42 after the empty area of the MLC block 51 is filled with the data items.

(6) When the MLC block 51 is filled with the data items, the write control unit 21 allocates a next free block 74 as a writing destination block for the MLC mode (depicted as MLC block 52), and writes data items received from the host 2 in the MLC block 52 in the MLC mode.

Figure 6:
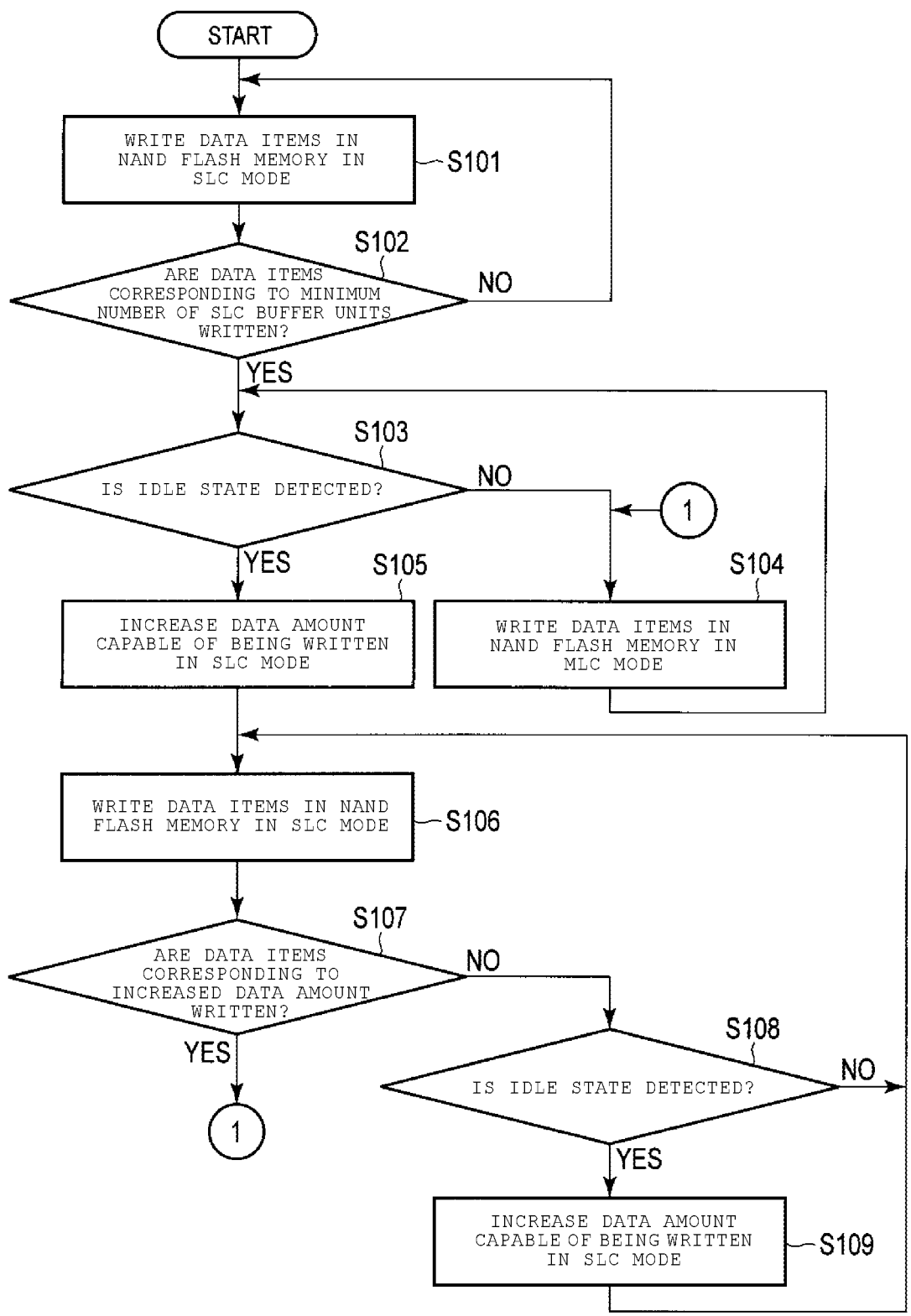
FIG. 6 is a flowchart showing a procedure of the write operation performed by the memory system according to the present embodiment.

A flowchart of FIG. 6 shows a procedure of the write operation performed by the controller 4.

In the present embodiment, the data items from the host 2 corresponding to the allowable data amount are preferentially written in the NAND flash memory 5 in the SLC mode. The allowable data amount is designated in advance by a parameter called a "minimum number of SLC buffer units".

That is, the write control unit 21 of the controller 4 initially selects the SLC mode, and writes data items received from the host 2 in the NAND flash memory 5 in the SLC mode (step S101).

When the amount of data items written in the NAND flash memory 5 reaches an allowable data amount, which is the amount of data items equivalent to the minimum number of SLC buffer units (YES at step S102), the write control unit 21 determines whether or not an idle state of the host interface 11 is detected by the idle state detection unit 22 (step S103).

When the idle state is not detected, that is, when the write operation is consecutively performed in the present time (NO at step S103), the write control unit 21 changes the write mode to the MLC mode, and writes data items received from the host 2 in the NAND flash memory 5 in the MLC mode (step S104).

For a period during which the write operation is consecutively performed, the write mode is maintained in the MLC mode. When the idle state is detected for a period during which the write operation is performed in the MLC mode (YES at step S103), the write control unit 21 increases the amount of data items capable of being written in the SLC mode, for example, by the amount of data items corresponding to one SLC buffer unit, and returns the write mode to the SLC mode (step S105). A unit by which the amount of data items capable of being written is increased is not limited to the amount of data items corresponding to one SLC buffer unit. For example, the allowable data amount may be increased by the amount of data items corresponding to two or more SLC buffer units. After the idle state, the write control unit 21 writes data items received from the host 2 in the NAND flash memory in the SLC mode (step S106).

The write control unit 21 determines whether or not the data items corresponding to the amount of data items increased in step S105 are written in the NAND flash memory in the SLC mode (step S107).

When the idle state is detected before the writing of the data items corresponding to the amount of increased data items is completed (NO at step S107 and YES at step S108), the write control unit 21 increases the amount of data items capable of being written in the SLC mode, for example, by the amount of data items corresponding to one SLC buffer unit (step S109).

When the writing of the data items corresponding to the total amount of increased data items is completed (YES at step S107), the write control unit 21 proceeds to the process of step S104, and changes the write mode to the MLC mode.

FIG. 7 shows an example of a write operation control parameter set used by the controller 4.

The write operation control parameter set is a parameter group used by the controller 4 in order to selectively use the SLC mode or the MLC mode. For example, the write operation control parameter set may be stored together with the firmware on the ROM (not shown). The write operation control parameter set may include the following parameters.
(1) SLC buffer unit
(2) Minimum number of SLC buffer units
(3) Maximum number of SLC buffer units
(4) Interval time
(5) Program/erase cycle count threshold A parameter of "SLC buffer unit" indicates the amount of data items in one SLC buffer unit. One SLC buffer unit is a unit for increasing the amount of data items capable of being written in the SLC mode. That is, whenever the idle state is detected, the allowable data amount is increased by the amount of data items corresponding to one SLC buffer unit or by the amount of data items to fill one SLC buffer unit.

A parameter of "minimum number of SLC buffer units" indicates the minimum number of SLC buffer units allocated as the allowable data amount. This parameter is equivalent to the amount of data items in the SLC buffer allocated as the SLC area in an initial state (for example, immediately after the shipment) of the SSD 3, that is, an initial value of the allowable data amount.

A parameter of "maximum number of SLC buffer units" indicates a maximum value of the number of SLC buffer units capable of being allocated. This value is equivalent to the maximum amount of data items capable of being written in the SLC mode. The maximum amount of the allowable data amount after the allowable data amount is increased from the initial state is restricted to be equal to or less than the maximum amount of data items capable of being written in the SLC mode, and does not exceed the maximum value of the number of SLC buffer units. That is, in the present embodiment, the allowable data amount is increased, for example, by the number corresponding to one SLC buffer unit whenever the idle state is detected. However, after the increased allowable data amount reaches the "maximum number of SLC buffer units", even though the idle state is detected, the amount of SLC buffers is not increased, and the write mode is maintained in the MLC mode. The increased allowable data amount is the amount of data items in the current SLC buffer unit, and means the amount of data items corresponding to a total value of the minimum number of SLC buffer units and the number of previously added SLC buffer units. In other words, the write control unit 21 increases the allowable data amount by a first data amount whenever the idle state is detected when the increased allowable data amount does not reach the maximum number of SLC buffer units. Accordingly, it is possible to prevent the storage capacity capable of being actually used by the host 2 from being further decreased than the user storage capacity reported to the host 2 by the SSD 3.

A parameter of "interval time" indicates a threshold time used for detecting the idle state. When a period during which a command is not received from the host 2 is maintained for a time which is equal to or greater than a time designated by the interval time, it is detected that the current state is the idle state, and the capacity of the SLC buffer is increased, for example, by the number corresponding to one SLC buffer unit.

A parameter of "program/erase cycle count threshold" is used as a condition for giving permission to increase the allowable data amount, similarly to the "maximum number of SLC buffer units". The permission to increase the allowable data amount (SLC buffer) is given until the number of program/erase cycles of the NAND flash memory 5 reaches the "program/erase cycle count threshold". After the number of program/erase cycles of the NAND flash memory 5 reaches the "program/erase cycle count threshold", even though the idle state is detected, the amount of SLC buffers is not increased, and the write mode is maintained in the MLC mode. Accordingly, it is possible to prevent the lifespan of the SSD 3 from being excessively decreased.

When the current number of program/erase cycles of the NAND flash memory 5 reaches the "program/erase cycle count threshold", even though the increased allowable data amount (the amount of data items in the current SLC buffer) is less than the "maximum number of SLC buffer units", the increase in the allowable data amount (SLC buffer) is prohibited.

A rate of the rise in the number of program/erase cycles of the NAND flash memory 5 depends on a pattern of write data items from the host 2. Accordingly, even within a period during which the increased allowable data amount is less than the "maximum number of SLC buffer units", the number of program/erase cycles of the NAND flash memory 5 may be excessively increased by the pattern of the write data from the host 2. In the present embodiment, the "program/erase cycle count threshold" is used as the condition for giving permission to increase the allowable data amount", and thus, it is possible to more reliably suppress the decrease in the lifespan of the SSD 3. Accordingly, it is possible to extend the lifespan of the storage.

As the condition for giving permission to increase the allowable data amount, any one of the "maximum number of SLC buffer units" and the "program/erase cycle count threshold" may be used, or both the "maximum number of SLC buffer units" and the "program/erase cycle count threshold" may be used.

In other words, only a first condition that the increased allowable data amount is less than the "maximum number of SLC buffer units" may be used as the condition for giving permission to increase the allowable data amount. Alternatively, only a second condition that the current number of program/erase cycles of the NAND flash memory 5 is equal to or less than the "program/erase cycle count threshold" may be used as the condition for giving permission to increase the allowable data amount. Alternatively, a third condition that the increased allowable data amount is less than the "maximum number of SLC buffer units" and the current number of program/erase cycles of the NAND flash memory 5 is equal to or less than the "program/erase cycle count threshold" may be used as the condition for giving permission to increase the allowable data amount.

The "program/erase cycle count threshold" may be a threshold Y1 for the comparison with the current total number of program/erase cycles for all the blocks of the NAND flash memory 5, may be a threshold Y2 for the comparison with the current maximum number of program/erase cycles in the NAND flash memory 5, may be a threshold Y3 for the comparison with the current average number of program/erase cycles of the NAND flash memory 5, or may be a threshold Y4 for the comparison with the current minimum number of program/erase cycles in the NAND flash memory 5.

When the program/erase cycle count threshold" is the threshold Y1 for the comparison with the current total number of program/erase cycles of the NAND flash memory 5, a process of increasing the capacity of the SLC buffer is permitted only when the current total number of program/erase cycles of the NAND flash memory 5 is equal to or less than the threshold Y1.

The current total number of program/erase cycles of the NAND flash memory 5 indicates the total number of program/erase cycles performed in the NAND flash memory 5, that is, the total value of the number of program/erase cycles for all the blocks within the NAND flash memory 5. The current total number of program/erase cycles may be calculated by sampling the number of program/erase cycles of some blocks.

When the "program/erase cycle count threshold" is the threshold Y2 for the comparison with the current maximum number of program/erase cycles in the NAND flash memory 5, the process of increasing the capacity of the SLC buffer is permitted only when the current maximum number of program/erase cycles of the NAND flash memory 5 is equal to or less than the threshold Y2. The current maximum number of program/erase cycles of the NAND flash memory 5 indicates a maximum value among the numbers of program/erase cycles of all the blocks within the NAND flash memory 5. The current maximum number of program/erase cycles may be calculated by sampling the number of program/erase cycles of some blocks.

When the "program/erase cycle count threshold" is the threshold Y3 for the comparison with the current average number of program/erase cycles of the NAND flash memory 5, the process of increasing the capacity of the SLC buffer is permitted only when the current average number of program/erase cycles of the NAND flash memory 5 is equal to or less than the threshold Y3. The current average number of program/erase cycles of the NAND flash memory 5 indicates an average value of the numbers of program/erase cycles of all the blocks within the NAND flash memory 5. The current average number of program/erase cycles may be calculated by sampling the number of program/erase cycles of some blocks.

When the "program/erase cycle count threshold" is the threshold Y4 for the comparison with the current minimum number in program/erase cycles of the NAND flash memory 5, the process of increasing the capacity of the SLC buffer is permitted only when the current minimum number of program/erase cycles of the NAND flash memory 5 is equal to or less than the threshold Y4. The current minimum number of program/erase cycles of the NAND flash memory 5 indicates a minimum value among the number of program/erase cycles of all the blocks within the NAND flash memory 5. The current minimum number of program/erase cycles may be calculated by sampling the number of program/erase cycles of some blocks.

Hereinafter, the "number of program/erase cycles" is referred to as the "number of P/E cycles".

Figure 8:
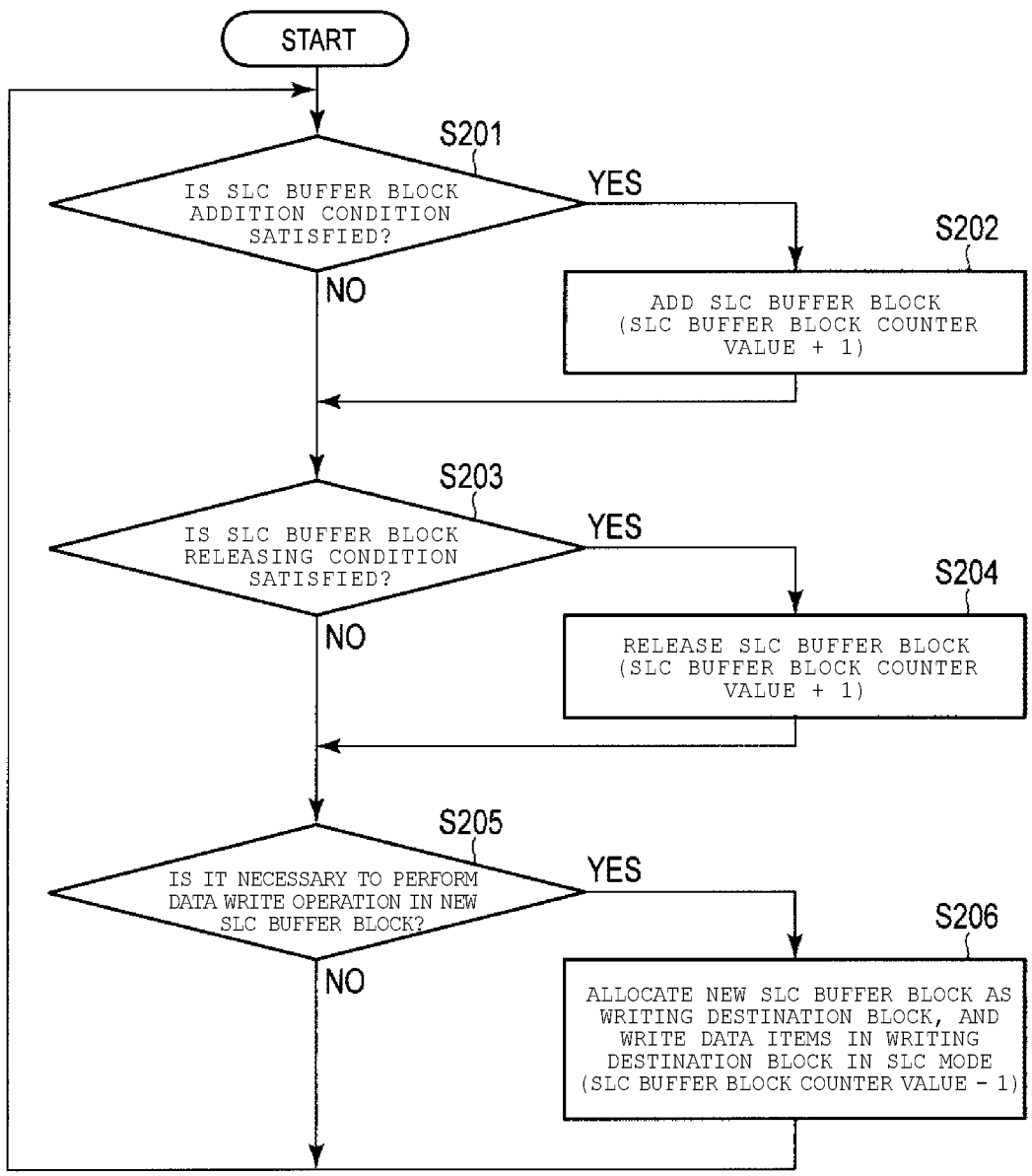
FIG. 8 is a flowchart showing a procedure of SLC buffer block addition/releasing/allocation processes performed by the memory system according to the present embodiment.

A flowchart of FIG. 8 shows a procedure of SLC buffer block addition/releasing/allocation processes performed by the controller 4.

The controller 4 determines whether or not an SLC buffer block addition condition is satisfied (step S201). The SLC buffer block addition condition indicates a necessary condition for giving permission to add the SLC buffer block. An example of the SLC buffer block addition condition includes at least the detection of the idle state. The example of the SLC buffer block addition condition may include at least one of (1) a condition that it is possible to achieve the lifespan of the storage (the current number of program/erase cycles of the NAND flash memory 5 is equal to or less than the program/erase cycle count threshold) and (2) a condition that the increased allowable data amount (the current amount of data items of the SLC buffer) does not exceed the preset maximum amount, as an additional necessary condition for giving permission to add the SLC buffer block.

Although the SLC buffer block is typically added whenever the idle state is detected, it is possible to use a mode in which the SLC buffer block is added only when there is no SLC buffer capable of being currently used or when the current amount of data items capable of being written in the SLC mode does not satisfy one SLC buffer unit.

When the SLC buffer block addition condition is satisfied (YES at step S201), the controller 4 adds one or more SLC buffer blocks corresponding to one SLC buffer unit, as the SLC buffer (step S202). In this case, the SLC count unit 23 increases the SLC buffer block counter value by one.

Subsequently, the controller 4 determines whether or not an SLC buffer block releasing condition is satisfied (step S203). The SLC buffer block releasing condition indicates a necessary condition for giving permission to release the SLC buffer block including valid data items, as the free block which does not include the valid data items.

When there is the SLC buffer block that satisfies the SLC buffer block releasing condition (YES at step S203), the controller 4 releases the SLC buffer block (step S204). For example, in step S204, the controller 4 releases the SLC buffer block as the free block by copying the valid data items within the SLC buffer block to another block. The block released as the free block may be maintained as the SLC buffer block in which the data is able to be written in the SLC mode, or may be moved to the free block pool for managing the free block group. In the former case, the SLC count unit 23 increases the SLC buffer block counter value by one.

Subsequently, the controller 4 determines whether or not it is necessary to perform a data write operation to a new SLC buffer block (step S205). When the current writing destination block is filled with the data items and the SLC buffer block counter value is equal to or greater than one, the controller determines that it is necessary to perform the data write operation to the new SLC buffer block. This is because it is necessary to allocate the new free block as the new writing destination block for the SLC mode.

When it is necessary to perform the data write operation to the new SLC buffer block (YES at step S205), the controller 4 allocates the new SLC buffer block as the new writing destination block for the SLC mode, and writes the data items from the host 2 to the writing destination block in the SLC mode (step S206). The SLC count unit 23 decreases the SLC buffer block counter value by one. A unit (e.g., minimum SLC buffer unit) by which the amount of data items capable of being written in the SLC mode is added may be a unit smaller than one SLC buffer unit. In this case, for example, the SLC buffer block counter value may be incremented by the minimum number of added SLC buffer units, or may be decremented by the minimum number of SLC buffer units used in the data writing.

Figure 9:
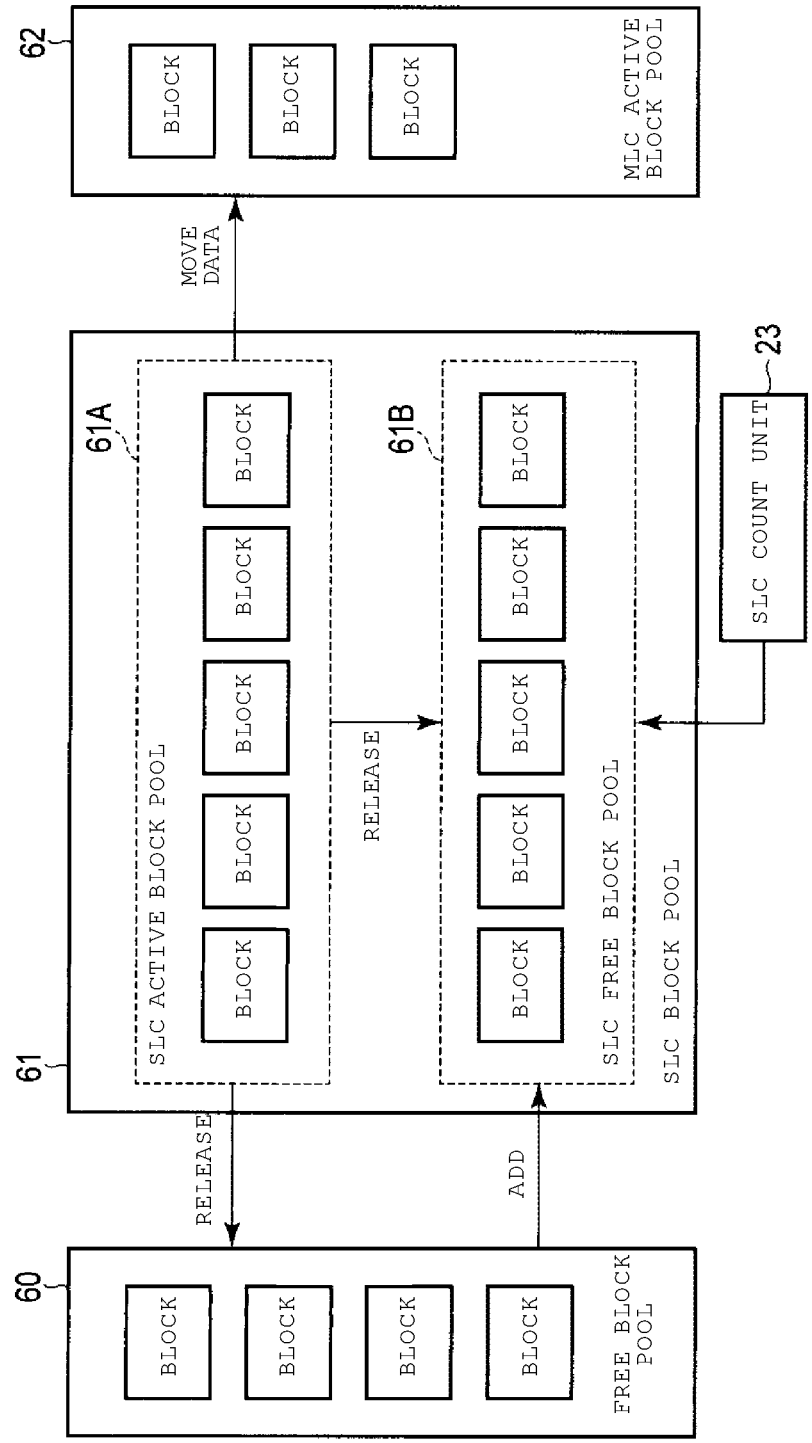
FIG. 9 is a diagram showing the relationship between a free block pool, an SLC block pool, and an MLC active block pool managed by the memory system according to the present embodiment.

FIG. 9 shows the relationship between a free block pool 60, an SLC block pool 61, and an MLC active block pool 62 managed by the controller 4.

The blocks are classified as an active block which contains valid data and a free block which does not contain valid data and is capable of being used in the writing of new data.

The active blocks are further classified into (1) and (2) as follows.

(1) SLC active blocks, in which data items are written in SLC mode; and (2) MLC active blocks, in which data items are written in MLC mode.

The free blocks are further divided into (3) and (4) as follows.

(3) SLC free blocks allocated to write data items in SLC mode; and (4) Complete free blocks for which writing in SLC mode or MLC mode has not been determined.

The SLC active blocks and the SLC free blocks are managed by a list called the SLC block pool 61.

The SLC block pool 61 includes an SLC active block pool 61A and an SLC free block pool 61B.

The SLC active blocks are managed by the SLC active block pool 61A. The SLC free blocks are managed by the SLC free block pool 61B.

The MLC active blocks are managed by a list called the MLC active block pool 62. The complete free blocks are managed by a list called the free block pool 60.

The SLC count unit 23 counts the number of blocks present in the SLC free block pool 61B.

The "addition of the SLC buffer block" is equivalent to a case where the block of the free block pool 60 is moved to the SLC free block pool 61B.

The "releasing of the SLC buffer block" is equivalent to a case where the SLC active block is released as the free block including only invalid data items by copying (moving) the valid data items stored in the SLC active block to another block. In a process of releasing the SLC buffer block, a process of moving valid data items within a certain SLC buffer block to the MLC block may be performed, or a garbage collection process of collecting valid data items from several SLC buffer blocks to one block may be performed.

The released block may be moved to the SLC free block pool 61B from the SLC active block pool 61A, or may be moved to the free block pool 60 from the SLC active block pool 61A. When the released block is moved to the SLC free block pool 61B from the SLC active block pool 61A, the SLC buffer block counter value is increased by the SLC count unit 23 by one.

Figure 10:
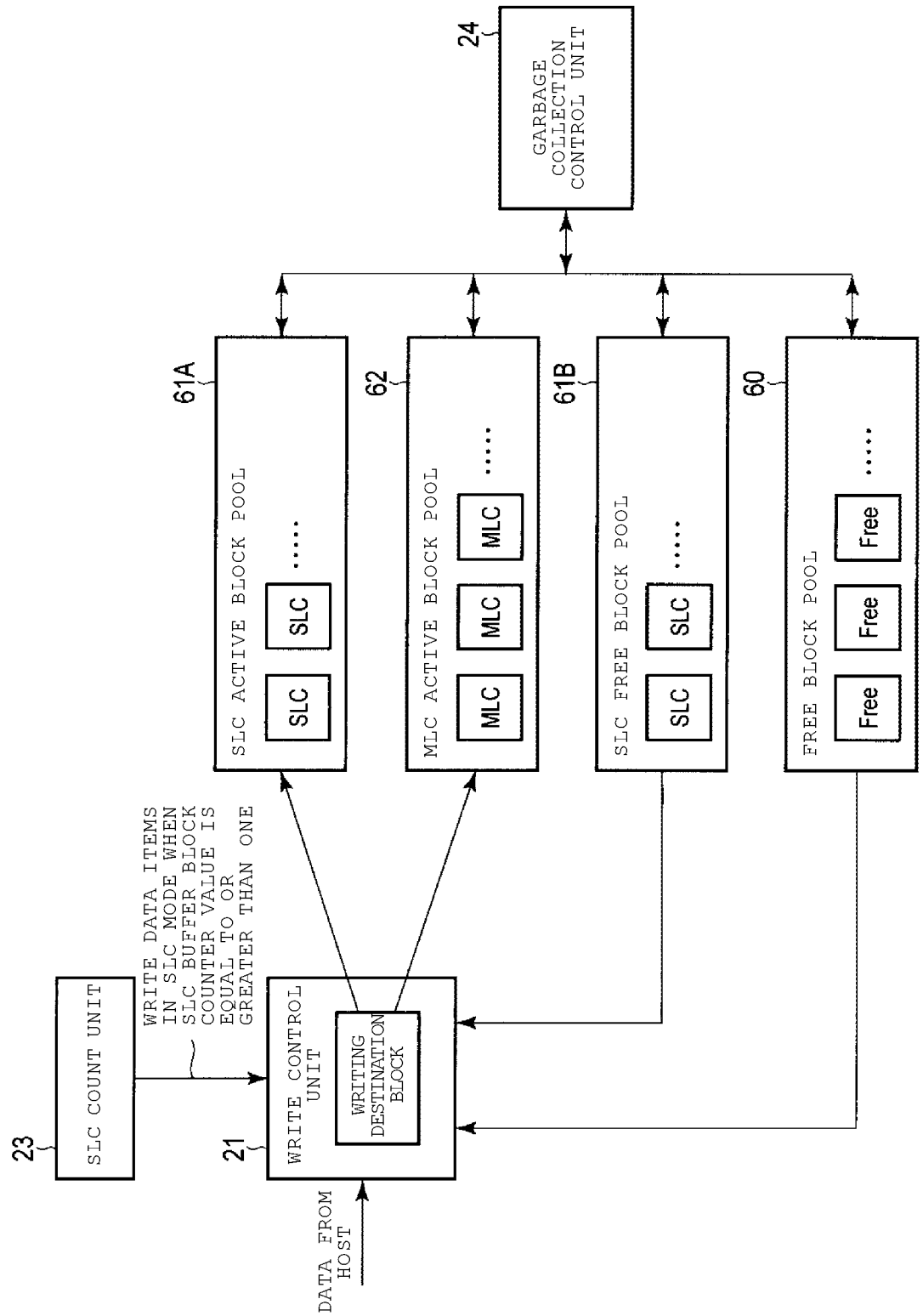
FIG. 10 is a diagram showing an example of a block management performed by the memory system according to the embodiment.

FIG. 10 shows an example of a block management performed by the controller 4.

In this example, the write operation is primarily described.

The write control unit 21 selects the SLC mode or the MLC mode as the write mode based on the SLC buffer block counter value counted by the SLC count unit 23. When the SLC buffer block counter value is equal to or greater than one, the write control unit 21 selects the SLC mode as the write mode, allocates the block of the SLC free block pool 61B as the writing destination block, and writes data items from the host 2 in the allocated block in the SLC mode. When the allocated block is filled with the data items from the host 2, the block is moved to the SLC active block pool 61A.

When the SLC buffer block counter value is zero, the write control unit 21 selects the MLC mode as the write mode, allocates the block of the free block pool 60 as the writing destination block, and writes the data from the host 2 in the allocated block in the MLC mode. When the allocated block is filled with the data items from the host 2, the block is moved to the MLC active block pool 62.

The garbage collection control unit 24 performs the garbage collection in order to increase the number of blocks (in this example, the complete free blocks and the SLC free blocks) in which the data items are able to be written.

In the garbage collection, the garbage collection control unit 24 selects several SLC active blocks or MLC active blocks which retain valid data items and invalid data items together, as the copying source blocks, and copies only the valid data items within the copying source blocks to the copying destination block. The copying destination block may be a free block within the free block pool 60, or may be an SLC free block within the SLC free block pool 61B. For example, when the valid data items are written in the free block within the free block pool 60 in the MLC mode, the blocks in which the valid data items are written in the MLC mode will be managed by the MLC active block pool 62. When the valid data items are written in the SLC free block within the SLC free block pool 61B in the SLC mode, the blocks in which the valid data items are written in the SLC mode will be managed by the SLC active block pool 61A.

In order to prevent the SLC buffer block counter value from being lost by the power off of the SSD 3, the controller 4 may store the current SLC buffer block counter value in the NAND flash memory 5 before the SSD 3 is powered off. In such a case, when the SSD 3 is powered on next, the stored SLC buffer block counter value is read from the NAND flash memory 5, and a write mode to be used is determined based on the read SLC buffer block counter value.

In a case where the controller 4 does not store the current SLC buffer block counter value in the NAND flash memory, the current SLC buffer block counter value is reset to be zero by the power off of the SSD 3. In this case, the blocks managed by the SLC free block pool 61B become the complete free blocks. When the SSD 3 is powered on next, since the SLC buffer block counter value is zero, the MLC mode is selected as the write mode. When the idle state is detected, the SLC buffer block is added, and the SLC buffer block counter value is increased by one.

Figure 11:
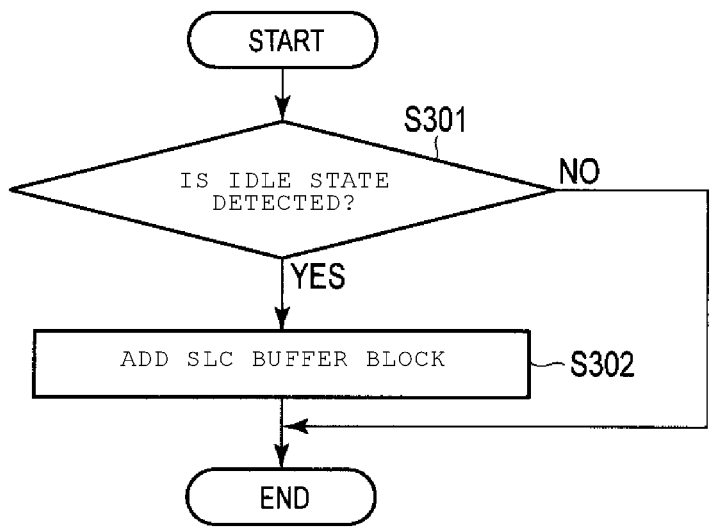
FIG. 11 is a flowchart of a procedure of the SLC buffer block addition process performed by the memory system according to the present embodiment.

A flowchart of FIG. 11 shows a procedure of the SLC buffer block addition process performed by the controller 4.

In this example, it is assumed that a necessary condition for giving permission to add the SLC buffer block is only the detection of the idle state.

The idle state detection unit 22 monitors a command received from the host 2 through the host interface 11, and detects a state in which the command is not received from the host 2 for a period of the interval time or more, as the idle state.

The kind of the command monitored for determining whether or not the current state is the idle state may be only the write command. In this case, the idle state detection unit 22 detects a first state in which the write command is not received from the host 2 for a period of the interval time or more, as the idle state.

The kind of the command monitored for determining whether or not the current state is the idle state may be any I/O command (e.g., the write command or the read command). In this case, the idle state detection unit 22 detects a second state in which the I/O command is not received from the host 2 for a period of the interval time or more, as the idle state. The second state is a state in which neither the write command nor the read command is received for a period of the interval time or more. When the I/O command is sent to the SSD 3 by the host 2, both the write command and the read command are stored in an I/O command queue within the controller 4. Accordingly, the idle state detection unit 22 may easily determine whether or not the I/O command is received from the host 2 by simply monitoring the I/O command queue.

The kind of the command monitored for determining whether or not the current state is the idle state may be both the I/O command and the control command. The control command may be an ADMIN command for managing the SSD 3. In this case, the idle state detection unit 22 detects a third state in which the I/O command and the control command are not received from the host 2 for a period of the interval time or more, as the idle state. The third state is a state in which neither the I/O command nor the control command is received for a period of the interval time or more. When the control command is sent to the SSD 3 by the host 2, the control command is stored in a control command queue in the controller 4. Accordingly, the idle state detection unit 22 can easily determine whether or not the control command is received from the host 2 by simply monitoring the control command queue.

When the sending of the command to the SSD 3 for a predetermined period or more is not scheduled, the host 2 may transmit a power management command for performing the transition of the SSD 3 to a lower power state (e.g., low power consumption state). The controller 4 transitions the state of the SSD 3 to the low power state in response to the reception of the power management command. Accordingly, the idle state detection unit 22 may detect the receipt of the power management command from the host 2, as the idle state. In other words, when the power management command is received, the idle state detection unit may immediately detect that the current state is the idle state at this time.

When the idle state is detected by the idle state detection unit 22 (YES at step S301), the write control unit 21 adds the SLC buffer block (step S302). Accordingly, the allowable data amount capable of being written in the SLC mode is increased, and thus, the SLC mode can be used as the write mode.

Figure 12:
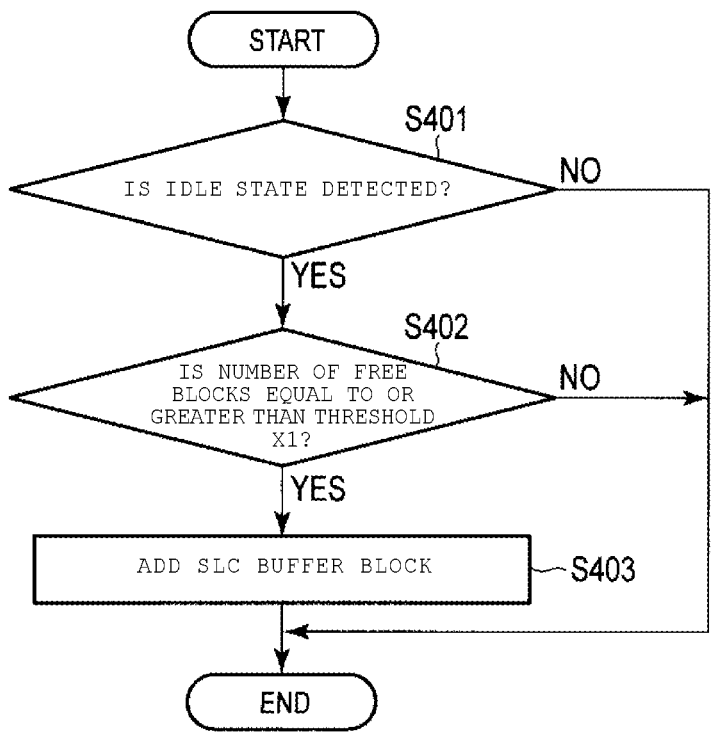
FIG. 12 is a flowchart of another procedure of the SLC buffer block addition process performed by the memory system according to the present embodiment.

A flowchart of FIG. 12 shows another procedure of the SLC buffer block addition process performed by the controller 4.

In this example, it is assumed that the necessary condition for giving permission to add the SLC buffer block is that the idle state is detected and the number of free blocks is equal to or greater than a threshold X1.

When the idle state is detected by the idle state detection unit 22 (YES at step S401), the controller 4 determines whether or not the number of remaining free blocks is equal to or greater than the threshold X1 (step S402). The number of remaining free blocks indicates the current number of free blocks managed by the free block pool 60.

When the number of remaining free blocks is equal to or greater than the threshold X1 (YES at step S402), the write control unit 21 adds the SLC buffer block (step S403). Accordingly, the allowable data amount capable of being written in the SLC mode is increased, and thus, the SLC mode can be used as the write mode.

When the number of free blocks is less than the threshold X1 (NO at step S402), the write control unit 21 does not add the SLC buffer block.

In step S403, the write control unit 21 may add the SLC buffer block because the number of remaining free blocks including the added SLC buffer block is equal to or greater than the threshold X1.

If the write operation is performed in the SLC mode when the number of remaining free blocks is small, the number of remaining free blocks is decreased to the threshold with which the garbage collection is started too early. When the writing of the data items from the host 2 is performed in parallel with the garbage collection, the write performance may be deteriorated. However, when the number of remaining free blocks is large, even though the write operation is performed in the SLC mode, the number of remaining free blocks is not immediately decreased to the threshold with which the garbage collection is started. Therefore, only when the number of remaining free blocks is large, it is effective to give permission to add the SLC buffer block.

For a period immediately after the garbage collection is performed, the write control unit 21 may select a threshold X1' greater than the threshold X1 and may determine whether or not the number of remaining free blocks is equal to or greater than the threshold X1' in step S402. Only when the number of remaining free blocks is equal to or greater than the threshold X1', the addition of the SLC buffer block is permitted. Through such control, it is possible to prevent the free block increased through the garbage collection from being consumed through the write operation using the SLC mode at a high speed.

Figure 13:
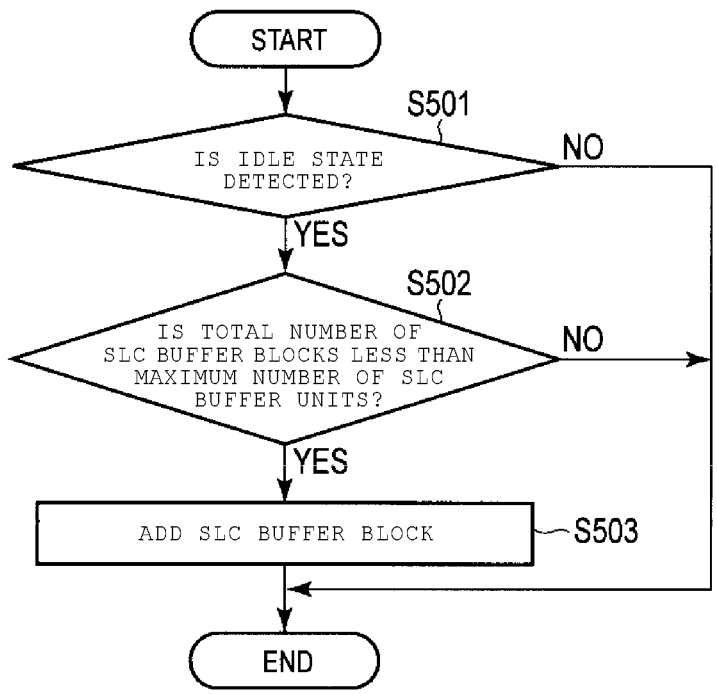
FIG. 13 is a flowchart of still another procedure of the SLC buffer block addition process performed by the memory system according to the present embodiment.

A flowchart of FIG. 13 shows still another procedure of the SLC buffer block addition process performed by the controller 4.

In this example, it is assumed that the necessary condition for giving permission to add the SLC buffer block is that the idle state is detected and the allowable data amount to be increased (reflecting the current amount of data items in the SLC buffer) is less than the maximum number of SLC buffer units.

The total number of SLC buffer blocks present in the SLC block pool 61, that is, the total of the number of SLC buffer blocks present in the SLC active block pool 61A and the number of SLC buffer blocks present in the SLC free block pool 61B may be used as a value indicating the allowable data amount to be increased.

When the idle state is detected by the idle state detection unit 22 (YES at step S501), the controller 4 determines whether or not the total number of SLC buffer blocks present in the SLC block pool 61 is less than the maximum number of SLC buffer units, that is, whether or not the allowable data amount to be increased is less than the maximum number of SLC buffer units (step S502). When the total number of SLC buffer blocks is less than the maximum number of SLC buffer units (YES at step S502), the write control unit 21 adds the SLC buffer block (step S503).

When the total number of SLC buffer blocks is excessively increased, the number of times of the write operations in the SLC mode is further increased than in a case where the total number of SLC buffer blocks is small, and thus, a rate at which the number of P/E cycles of the NAND flash memory 5 is increased, is increased. Accordingly, the lifespan of the SSD 3 may become shortened. Therefore, it is effective to restrict the increase in the allowable data amount capable of being written in the SLC mode by setting an upper limit such as the maximum number of SLC buffer units (which is equivalent to the maximum amount of data items capable of being written in the SLC mode).

Figure 14:
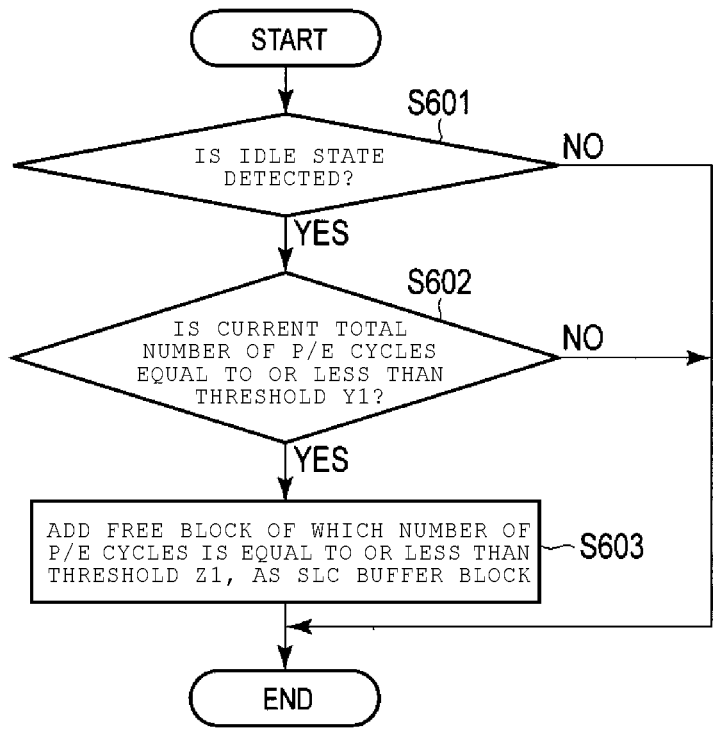
FIG. 14 is a flowchart of still another procedure of the SLC buffer block addition process performed by the memory system according to the present embodiment.

A flowchart of FIG. 14 shows still another procedure of the SLC buffer block addition process performed by the controller 4.

In this example, it is assumed that the necessary condition for giving permission to add the SLC buffer block is that the idle state is detected and the number of P/E cycles of the NAND flash memory 5 is equal to or less than the threshold. Although a case where the total number of P/E cycles of the NAND flash memory 5 is used as the number of P/E cycles of the NAND flash memory 5 will be described below, the maximum number of P/E cycles in the NAND flash memory 5, the minimum number of P/E cycles in the NAND flash memory 5, or the average number of P/E cycles of the NAND flash memory 5 may be used instead of the total number of P/E cycles. That is, the necessary condition for giving permission to add the SLC buffer block is not limited to the total number of P/E cycles of the NAND flash memory 5, and any index that may determine the lifespan of the NAND flash memory 5 may be used.

When the idle state is detected by the idle state detection unit 22 (YES at step S601), the controller 4 determines whether or not the current total number of P/E cycles of the NAND flash memory 5 is equal to or less than the threshold Y1 (step S602).

When the current total number of P/E cycles is equal to or less than the threshold Y1 (YES at step S602), the write control unit 21 selects the free block of which the number of P/E cycles is equal to or less than a threshold Z1 (for example, Z1<Y1) from the free block pool 60, and adds the selected block as the SLC buffer block (step S603).

When the allowable data amount capable of being written in the SLC mode is increased, a rate at which the total number of P/E cycles is increased is increased. Thus, if the allowable data amount is increased when the total number of P/E cycles is large, the lifespan of the SSD 3 may be shortened. Therefore, when the total number of P/E cycles is large, it is effective to prohibit the addition of the allowable data amount capable of being written in the SLC mode.

In step S603, the free block of which the number of P/E cycles is small is allocated as the block in which the writing is performed in the SLC mode. That is, since a deviation in the number of P/E cycles between the blocks is small, it is possible to extend the lifespan of the SSD 3.

Although the controller 4 determines whether or not to add the SLC buffer block based on the current total number of P/E cycles of the NAND flash memory 5 in step S602, methods to be described below may be used.

(A) When the current maximum number of P/E cycles in the NAND flash memory 5 is equal to or less than the threshold Y2, the process of adding the SLC buffer block is permitted.

(B) When the current average number of P/E cycles of the NAND flash memory 5 is equal to or less than the threshold Y3, the process of increasing the capacity of the SLC buffer is permitted.

(C) When the current minimum number of P/E cycles in the NAND flash memory 5 is equal to or less than the threshold Y4, the process of adding the SLC buffer block is permitted.

Figure 15:
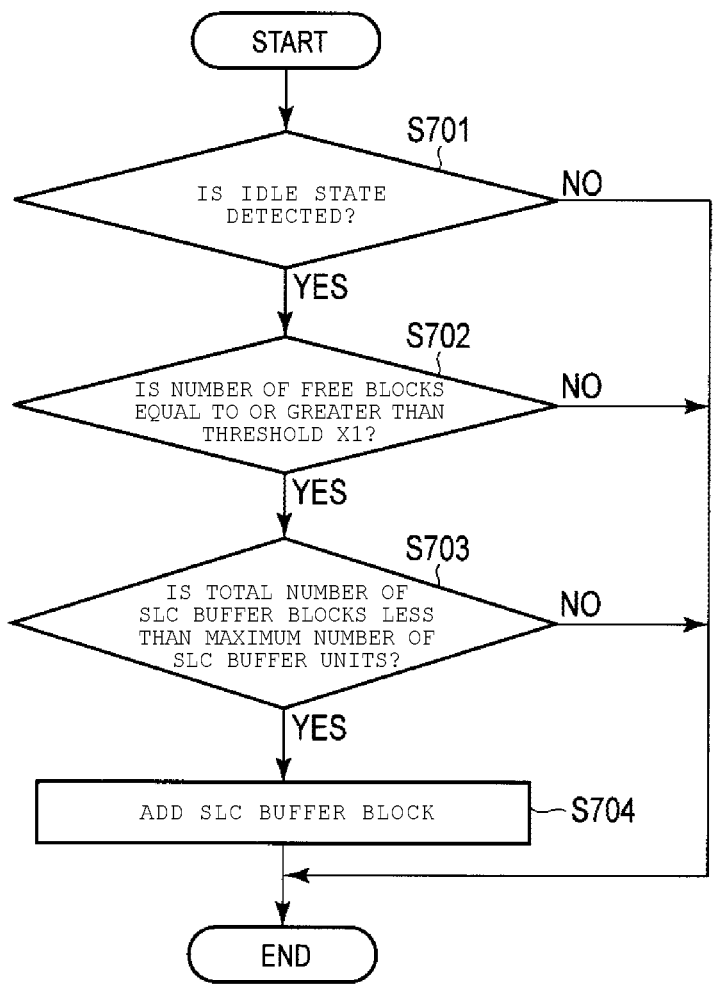
FIG. 15 is a flowchart of still another procedure of the SLC buffer block addition process performed by the memory system according to the present embodiment.

A flowchart of FIG. 15 shows still another procedure of the SLC buffer block addition process performed by the controller 4.

In this example, it is assumed that the necessary condition for giving permission to add the SLC buffer block is that the idle state is detected, the number of free blocks is equal to or greater than the threshold X1, and the allowable data amount to be increased is less than the maximum number of SLC buffer units.

When the idle state is detected by the idle state detection unit 22 (YES at step S701), the controller 4 determines whether or not the number of remaining free blocks is equal to or greater than the threshold X1 (step S702). The number of remaining free blocks indicates the current number of free blocks managed by the free block pool 60.

When the number of remaining free blocks is equal to or greater than the threshold X1 (YES at step S702), the controller 4 determines whether or not the total number of SLC buffer blocks present in the SLC block pool 61 is less than the maximum number of SLC buffer units, that is, whether or not the allowable data amount to be increased is less than the maximum number of SLC buffer units (step S703). When the total number of SLC buffer blocks is less than the maximum number of SLC buffer units (YES at step S703), the write control unit 21 adds the SLC buffer block (step S704).

As stated above, a condition that the idle state is detected, the number of free blocks is equal to or greater than the threshold X1, and the allowable data amount to be increased is less than the maximum number of SLC buffer units may be set as the SLC buffer block addition condition, and thus, the addition of the SLC buffer block may be restricted.

Figure 16:
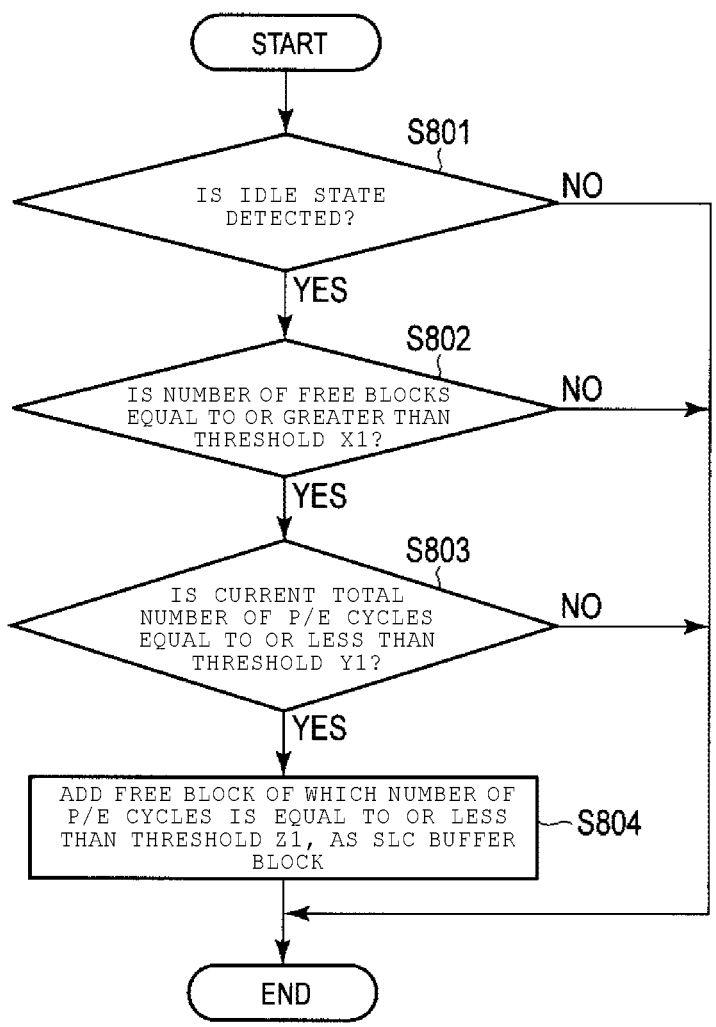
FIG. 16 is a flowchart of still another procedure of the SLC buffer block addition process performed by the memory system according to the present embodiment.

A flowchart of FIG. 16 shows still another procedure of the SLC buffer block addition process performed by the controller 4.

In this example, it is assumed that the necessary condition for giving permission to add the SLC buffer block is that the idle state is detected, the number of free blocks is equal to or greater than the threshold X1, and the number of P/E cycles of the NAND flash memory 5 is equal to or less than the threshold. Although a case where the total number of P/E cycles of the NAND flash memory 5 is used as the number of P/E cycles of the NAND flash memory 5 will be described below, the maximum number of P/E cycles in the NAND flash memory 5, the minimum number of P/E cycles in the NAND flash memory 5, or the average number of P/E cycles of the NAND flash memory 5 may be used instead of the total number of P/E cycles.

When the idle state is detected by the idle state detection unit 22 (YES at step S801), the controller 4 determines whether or not the number of remaining free blocks is equal to or greater than the threshold X1 (step S802). The number of remaining free blocks indicates the current number of free blocks managed by the free block pool 60.

When the number of remaining free blocks is equal to or greater than the threshold X1 (YES at step S802), the controller 4 determines whether or not the current total number of P/E cycles of the NAND flash memory 5 is equal to or less than the threshold Y1 (step S803). In step S803, any one method of (A), (B), and (C) described above may be used.

When the current total number of P/E cycles is equal to or less than the threshold Y1 (YES at step S803), the write control unit 21 selects the free block of which the number of P/E cycles is equal to or less than the threshold Z1 from the free block pool 60, and adds the selected block as the SLC buffer block (step S804).

As stated above, a condition that the idle state is detected, the number of free blocks is equal to or greater than the threshold X1, and the number of P/E cycles of the NAND flash memory 5 is equal to or less than the threshold may be set as the SLC buffer block addition condition, and thus, the addition of the SLC buffer block may be restricted.

Figure 17:
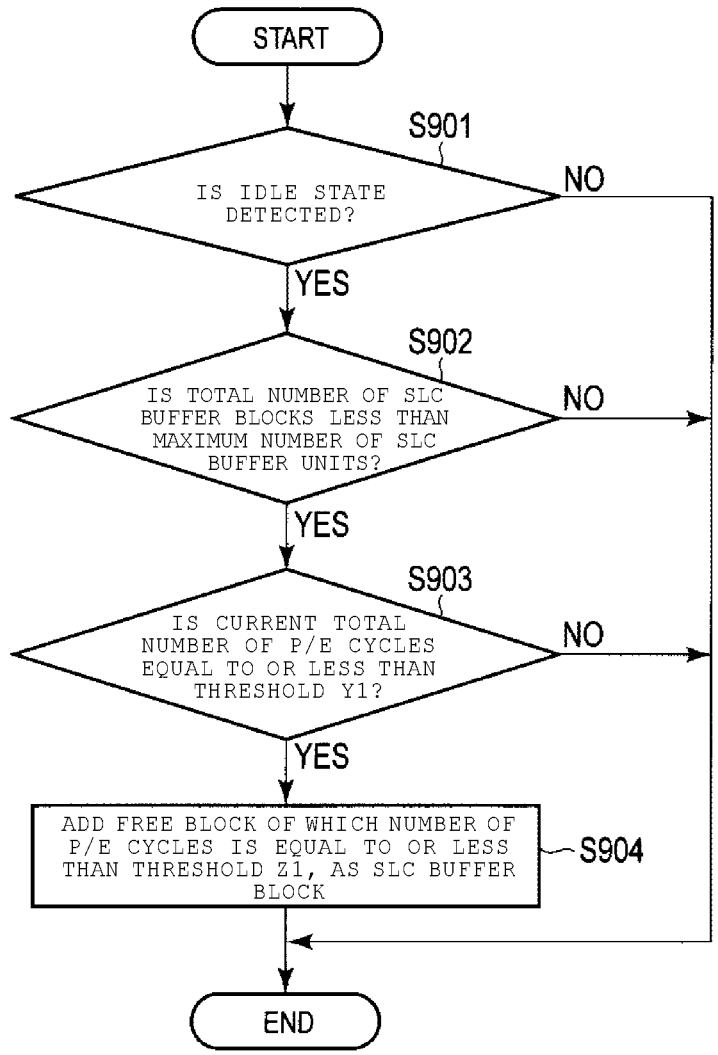
FIG. 17 is a flowchart of still another procedure of the SLC buffer block addition process performed by the memory system according to the present embodiment.

A flowchart of FIG. 17 shows still another procedure of the SLC buffer block addition process performed by the controller 4.

In this example, it is assumed that the necessary condition for giving permission to add the SLC buffer block is that the idle state is detected, the allowable data amount to be increased is less than the maximum number of SLC buffer units, and the number of P/E cycles of the NAND flash memory 5 is equal to or less than the threshold. Although a case where the total number of P/E cycles of the NAND flash memory 5 is used as the number of P/E cycles of the NAND flash memory 5 will be described below, the maximum number of P/E cycles in the NAND flash memory 5, the minimum number of P/E cycles in the NAND flash memory 5, or the average number of P/E cycles of the NAND flash memory 5 may be used instead of the total number of P/E cycles.

When the idle state is detected by the idle state detection unit 22 (YES at step S901), the controller 4 determines whether or not the total number of SLC buffer blocks present in the SLC block pool 61A is less than the maximum number of SLC buffer units, that is, the allowable data amount to be increased is less than the maximum number of SLC buffer units (step S902).

When the total number of SLC buffer blocks is less than the maximum number of SLC buffer units (YES at step S902), the controller 4 determines whether or not the current total number of P/E cycles of the NAND flash memory 5 is equal to or less than the threshold Y1 (step S903). In step S903, any one method of (A), (B), and (C) described above may be used.

When the current total number of P/E cycles is equal to or less than the threshold Y1 (YES at step S903), the write control unit 21 selects the free block of which the number of P/E cycles is equal to or less than the threshold Z1 from the free block pool 60, and adds the selected block as the SLC buffer block (step S904).

As stated above, a condition that the idle state is detected, the allowable data amount to be increased is less than the maximum number of SLC buffer units, and the number of P/E cycles of the NAND flash memory 5 is equal to or less than the threshold may be set as the SLC buffer block addition condition, and the addition of the SLC buffer block may be restricted.

Figure 18:
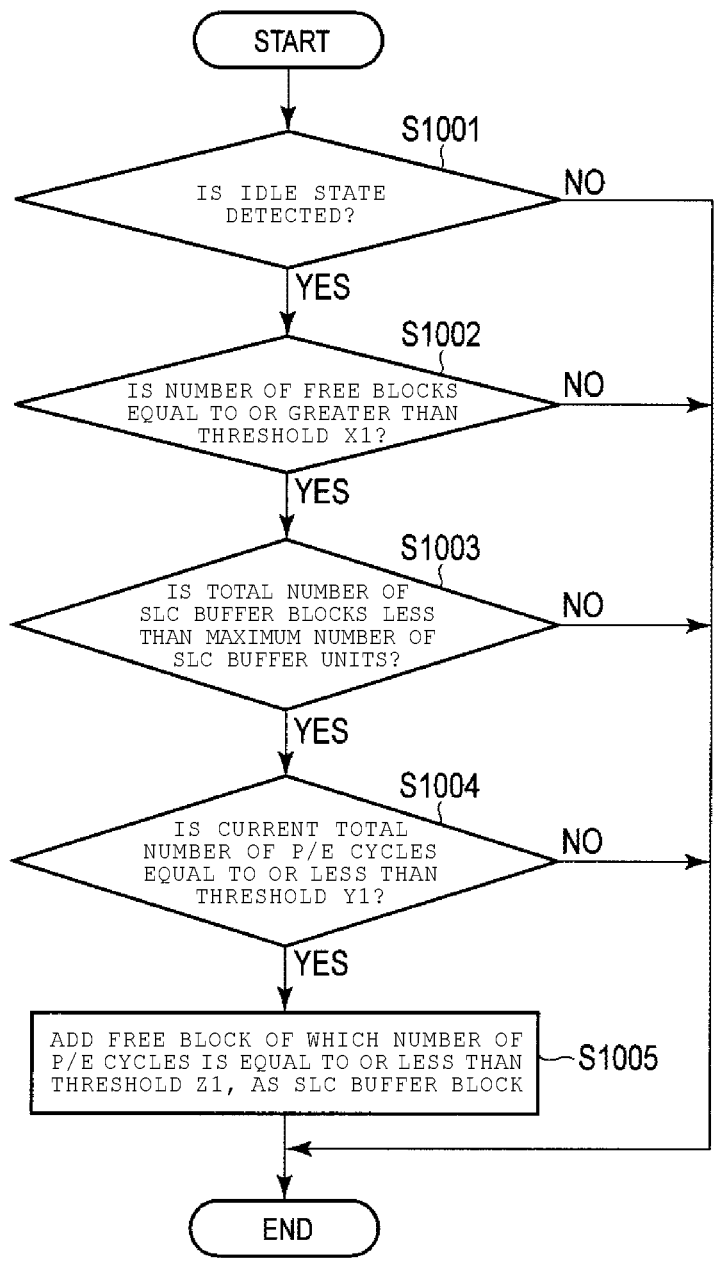
FIG. 18 is a flowchart of still another procedure of the SLC buffer block addition process performed by the memory system according to the present embodiment.

A flowchart of FIG. 18 shows still another procedure of the SLC buffer block addition process performed by the controller 4.

In this example, it is assumed that the necessary condition for giving permission to add the SLC buffer block is that the idle state is detected, the number of free blocks is equal to or greater than the threshold X1, the allowable data amount to be increased is less than the maximum number of SLC buffer units, and the number of P/E cycles of the NAND flash memory 5 is equal to or less than the threshold. Although a case where the total number of P/E cycles of the NAND flash memory 5 is used as the number of P/E cycles of the NAND flash memory 5 will be described below, the maximum number of P/E cycles in the NAND flash memory 5, the minimum number of P/E cycles in the NAND flash memory 5, or the average number of P/E cycles of the NAND flash memory 5 may be used instead of the total number of P/E cycles.

When the idle state is detected by the idle state detection unit 22 (YES at step S1001), the controller 4 determines whether or not the number of remaining free blocks is equal to or greater than the threshold X1 (step S1002). The number of remaining free blocks indicates the current number of free blocks managed by the free block pool 60.

When the number of remaining free blocks is equal to or greater than the threshold X1 (YES at step S1002), the controller 4 determines whether or not the total number of SLC buffer blocks present in the SLC block pool 61 is less than the maximum number of SLC buffer units, that is, whether or not the allowable data amount to be increased is less than the maximum number of SLC buffer units (step S1003). When the total number of SLC buffer blocks is less than the maximum number of SLC buffer units (YES at step S1003), the controller 4 determines whether or not the current total number of P/E cycles of the NAND flash memory 5 is equal to or less than the threshold Y1 (step S1004). In step S1004, any one method of (A), (B), and (C) described above may be used.

When the current total number of P/E cycles is equal to or less than the threshold Y1 (YES at step S1005), the write control unit 21 selects the free block of which the number of P/E cycles is equal to or less than the threshold Z1 from the free block pool 60, and adds the selected block as the SLC buffer block (step S1005).

As mentioned above, a condition that the idle state is detected, the number of free blocks is equal to or greater than the threshold X1, the allowable data amount to be increased is less than the maximum number of SLC buffer units, and the number of P/E cycles of the NAND flash memory 5 is equal to or less than the threshold may be set as the SLC buffer block addition condition, and the addition of the SLC buffer block may be restricted.

Figure 19:
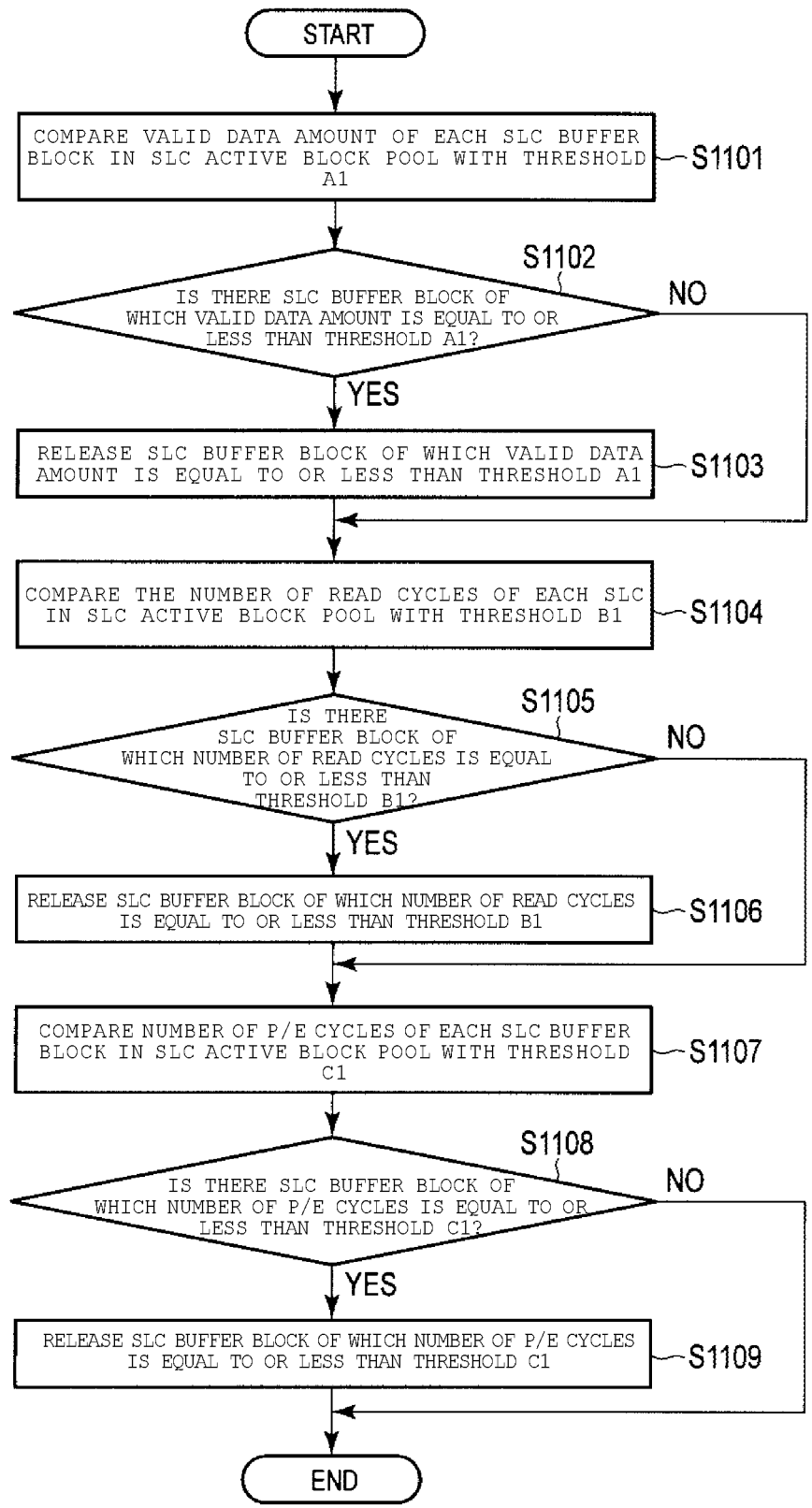
FIG. 19 is a flowchart of a procedure of the SLC buffer block releasing process performed by the memory system according to the present embodiment.

A flowchart of FIG. 19 shows a procedure of the SLC buffer block releasing process performed by the controller 4.

The controller 4 performs the process of releasing the SLC buffer block that satisfies the SLC buffer block releasing condition. The SLC buffer block releasing condition is a necessary condition for giving permission to release the SLC buffer block including valid data items as the free block which does not include valid data items. An example of the SLC buffer block releasing condition includes the following conditions.

(1) Amount of valid data items in SLC buffer block is equal to or less than threshold
(2) Number of read cycles of data items in SLC buffer block is equal to or less than threshold
(3) Number of P/E cycles of SLC buffer block is equal to or less than threshold The condition (1) is used for selecting the SLC buffer block that has a small amount of data items that need to be copied in order to release the SLC buffer block.

The condition (2) is used for selecting the SLC buffer block that stores data items which are read by the host 2 with a low frequency. The SLC buffer block that stores data items which are read with a low frequency is released as the free block, and thus, it is possible to use the SLC buffer block in storing new data items such as the data items which are read by the host 2 with a high frequency.

The condition (3) is used for selecting the SLC buffer block that stores cold data items (i.e., data items having a low update frequency). The SLC buffer block that stores the cold data items is released as the free block, and thus, it is possible to actively use the SLC buffer block as new writing destination block. As a result, it is possible to perform wear leveling for leveling the number of P/E cycles for all the blocks.

A threshold to be compared with the number of P/E cycles of each SLC buffer block may be the average number of P/E cycles for all the blocks, or may be the minimum value among the number of P/E cycles of all the blocks (that is, the current minimum number of program/erase cycles in the NAND flash memory 5). In the latter case, the SLC buffer block having the minimum number of program/erase cycles is selected as the releasing target.

Initially, the controller 4 compares the amount of valid data items of each SLC buffer block in the SLC active block pool 61A with a threshold A1 in order to determine whether or not there is the SLC buffer block that satisfies the condition (1) (step S1101).

When there is the SLC buffer block of which the amount of valid data items is equal to or less than the threshold A1 (YES at step S1102), the controller 4 selects the SLC buffer block as the releasing target block, and releases the selected SLC buffer block (step S1103). In step S1103, the valid data items in the selected SLC buffer block may be moved to an MLC block, or may be moved to another SLC buffer block. In the process of moving the valid data items in the selected SLC buffer block to the MLC block, a process of writing the valid data items in the SLC buffer block into the free block in the MLC mode is performed, and thus, the valid data items are moved to the MLC block. In the process of moving the valid data items in the selected SLC buffer block to another SLC buffer block, the process of writing the valid data items in the selected SLC buffer block into a complete free block or an SLC free block in the SLC mode is performed, and thus, the valid data items are moved to another SLC buffer block.

Subsequently, the controller 4 compares the number of read cycles of each SLC buffer block in the SLC active block pool 61A with a threshold B1 (step S1104).

When there is the SLC buffer block of which the number of read cycles is equal to or less than the threshold B1 (YES at step S1105), the controller 4 selects the SLC buffer block of which the number of read cycles is equal to or less than the threshold B1, as the releasing target block, and releases the selected SLC buffer block (step S1106). In step S1106, the valid data items in the selected SLC buffer block may be moved to an MLC block, or may be moved to another SLC buffer block.

Subsequently, the controller 4 compares the number of P/E cycles of each SLC buffer block in the SLC active block pool 61A with a threshold C1 (step S1107).

When there is the SLC buffer block of which the number of P/E cycles is equal to or less than the threshold C1 (YES at step S1108), the controller 4 selects the SLC buffer block of which the number of P/E cycles is equal to or less than the threshold C1, as the releasing target block, and releases the selected SLC buffer block (step S1109). In this example, the current average number of P/E cycles of the NAND flash memory 5 or the current minimum number of P/E cycles of the NAND flash memory 5 may be used as the threshold C1. When the minimum number of P/E cycles is used as the threshold C1, the SLC buffer block having the minimum number of P/E cycles is selected as the releasing target block from the SLC active block pool 61A.

In step S1109, the valid data items in the selected SLC buffer block may be moved to an MLC block, or may be moved to another SLC buffer block.

Figure 20:
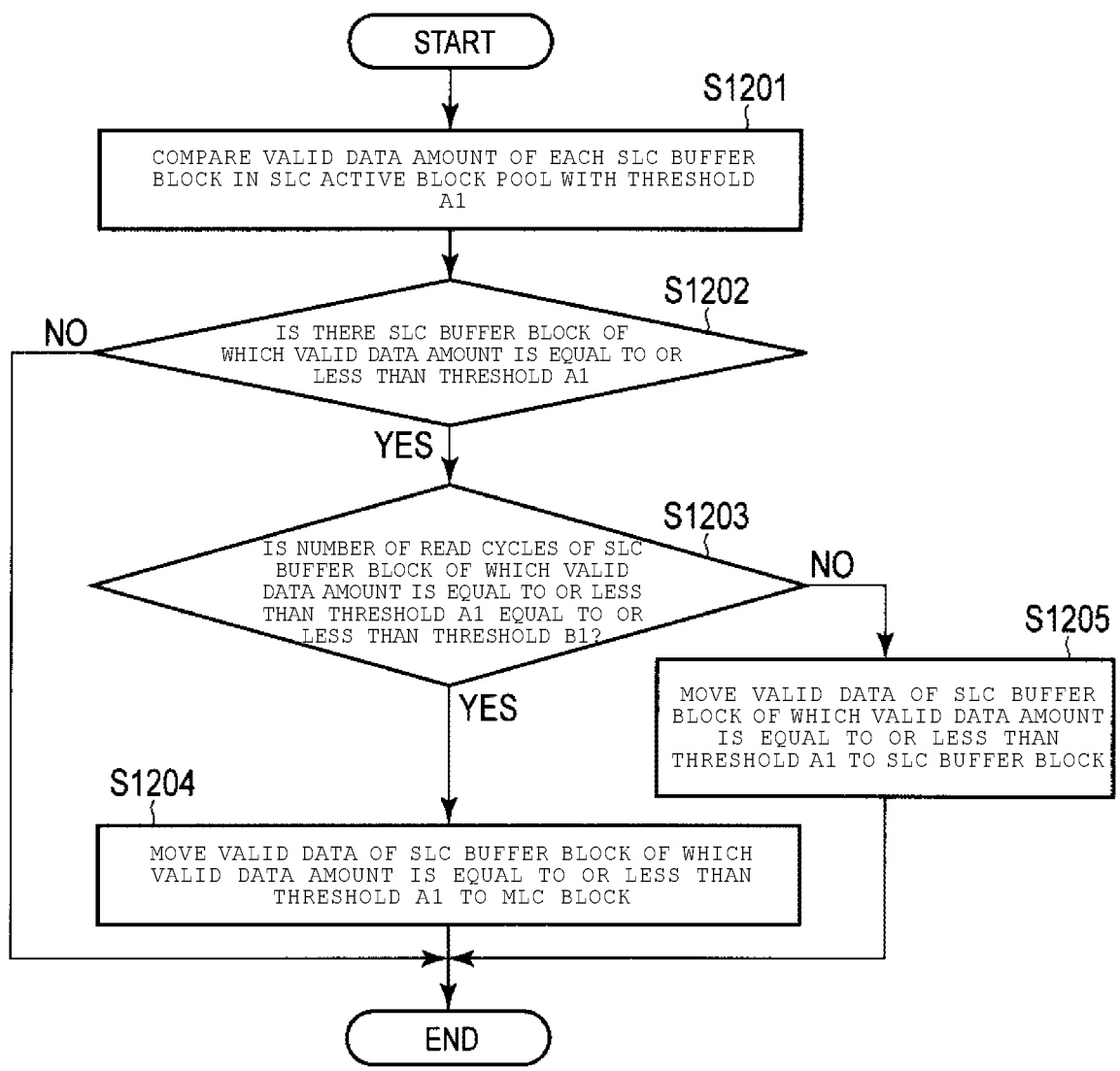
FIG. 20 is a flowchart of another procedure of the SLC buffer block releasing process performed by the memory system according to the present embodiment.

A flowchart of FIG. 20 shows another procedure of the SLC buffer block releasing process performed by the controller 4.

The controller 4 compares the amount of valid data items of each SLC buffer block in the SLC active block pool 61A with the threshold A1 (step S1201).

When there is the SLC buffer block of which the amount of valid data items is equal to or less than the threshold A1 (YES at step S1202), the controller 4 selects the SLC buffer block of which the amount of valid data items is equal to or less than the threshold A1, as the SLC buffer block which is the releasing target block, and determines whether or not the number of read cycles of the selected SLC buffer block is equal to or less than the threshold B1 (step S1203).

When the number of read cycles of the selected SLC buffer block is equal to or less than the threshold B1 (YES at step S1203), the controller 4 moves the valid data items in the selected SLC buffer block to an MLC block (step S1204).

When the number of read cycles of the selected SLC buffer block exceeds the threshold B1 (NO at step S1203), the controller 4 moves the valid data items in the selected SLC buffer block to another SLC buffer block (step S1205).

When the number of read cycles of the selected SLC buffer block is large, since a frequency with which the data items stored in the selected SLC buffer block are read is high, if the data items are moved to the MLC block, the read performance for these data items may be deteriorated. When the number of read cycles of the selected SLC buffer block is small, since the frequency with which the data items stored in the selected SLC buffer block are read is low, even though the data items are moved to the MLC block, there is little influence due to the deterioration of the read performance for these data items.

Figure 21:
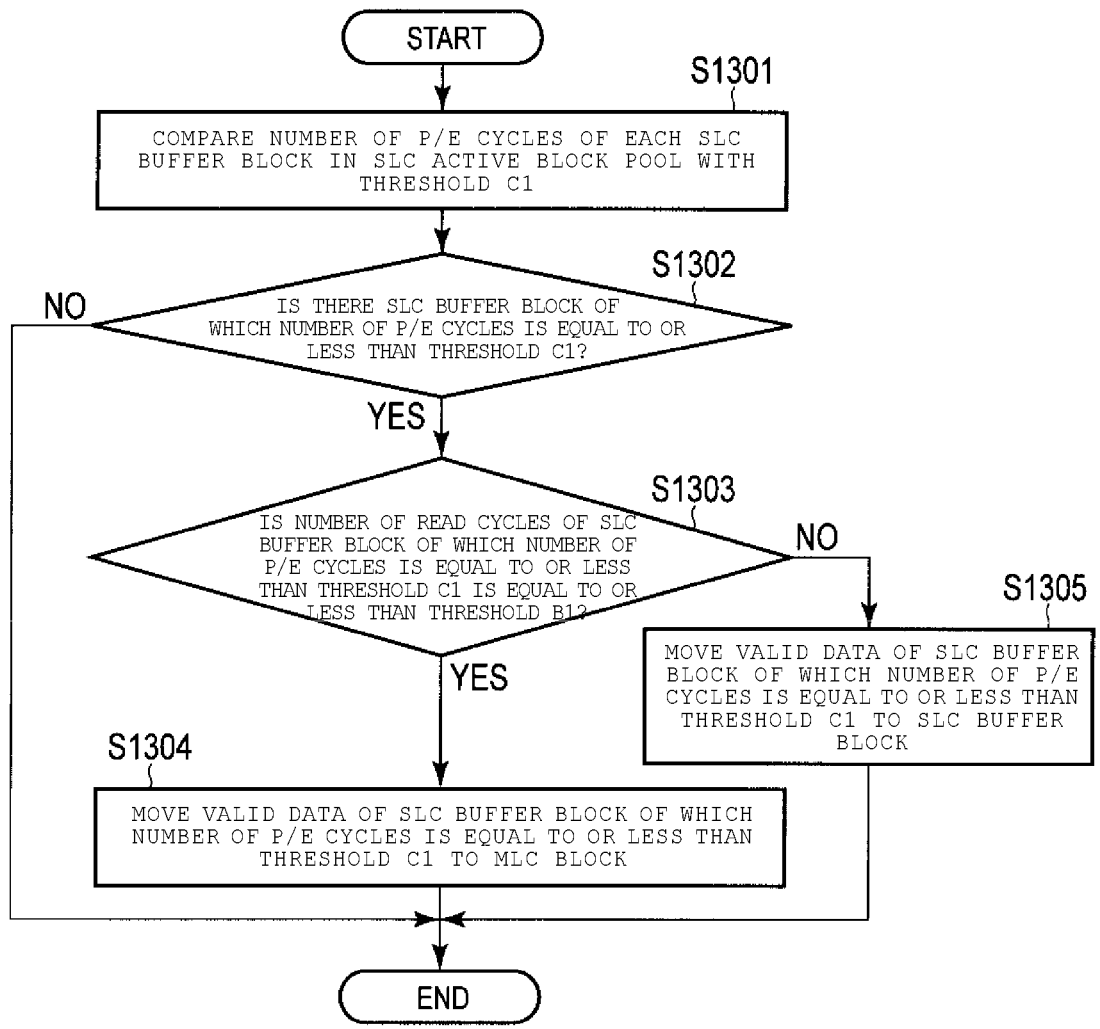
FIG. 21 is a flowchart of still another procedure of the SLC buffer block releasing process performed by the memory system according to the present embodiment.

A flowchart of FIG. 21 shows still another procedure of the SLC buffer block releasing process performed by the controller 4.

The controller 4 compares the number of P/E cycles of each SLC buffer block in the SLC active block pool 61A with the threshold C1 (step S1301).

When there is the SLC buffer block of which the number of P/E cycles is equal to or less than the threshold C1 (YES at step S1302), the controller 4 selects the SLC buffer block of which the number of P/E cycles is equal to or less than the threshold C1, as the SLC buffer block which is the releasing target block, and determines whether or not the number of read cycles of the selected SLC buffer block is equal to or less than the threshold B1 (step S1303).

When the number of read cycles of the selected SLC buffer block is equal to or less than the threshold B1 (YES at step S1303), the controller 4 moves the valid data items in the selected SLC buffer block to an MLC block (step S1204).

When the number of read cycles of the selected SLC buffer block exceeds the threshold B1 (NO at step S1303), the controller 4 moves the valid data items in the selected SLC buffer block to another SLC buffer block (step S1305).

The current average number of P/E cycles of the NAND flash memory 5 may be used as a value of the threshold C1. In this case, the SLC buffer block of which the number of P/E cycles is equal to or less than the average number of P/E cycles is selected as the SLC buffer block which is the releasing target. Alternatively, the current minimum number of P/E cycles in the NAND flash memory 5 may be used as a value of the threshold C1. In this case, the SLC buffer block having the minimum number of P/E cycles is selected as the SLC buffer block which is the releasing target from the SLC active block pool 61A.

Figure 22:
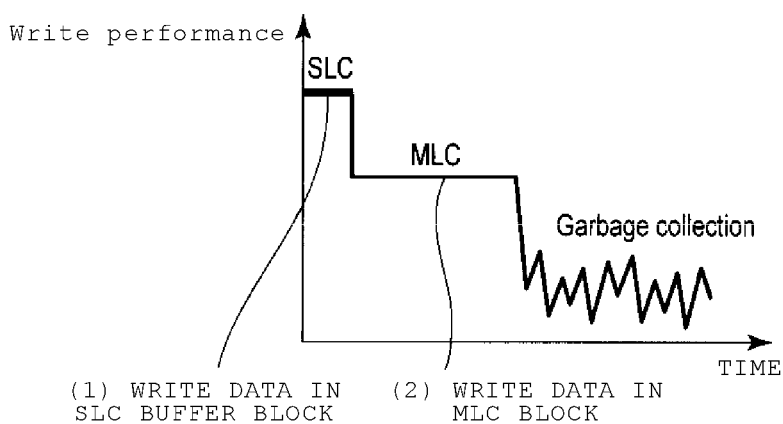
FIG. 22 is a timing chart showing the write operation performed by the memory system according to the present embodiment when the idle state is not detected.

A timing chart of FIG. 22 shows the write operation performed by the controller 4 of the SSD 3 when the idle state is not detected.

In this example, it is assumed that the allowable data amount is the amount of data items corresponding to one SLC buffer block for simplicity of illustration.

(1) Initially, the write control unit 21 selects the SLC mode as the write mode. The write control unit 21 writes the data items received from the host 2 in the SLC buffer block in the SLC mode. In this case, a write speed in the SLC mode is faster than a write speed in the MLC mode (thus, the write performance in the SLC mode is higher than that in the MLC mode).

(2) When the SLC buffer unit is filled with the data items, that is, when the data items corresponding to the allowable data amount are written in the SLC mode, the write control unit 21 changes the write mode to the MLC mode. The write control unit 21 writes the data items received from the host 2 in the MLC block in the MLC mode. In this case, a write speed in the MLC mode is slower than that in a case where the writing is performed in the SLC mode (thus, the write performance in the MLC mode is lower than that in the SLC mode). In contrast, since a rate at which the total number of P/E cycles is increased in the MLC mode is lower than that in writing in the SLC mode, it is possible to prevent the lifespan of the SSD 3 from being shortened unlike a case where the writing is performed continuously in the SLC mode.

When the data items are continuously written with no change in the write mode, the number of remaining free blocks is decreased up to a certain threshold. In doing so, the garbage collection control unit 24 performs the garbage collection in order to increase the number of free blocks. When the garbage collection is performed, since the data items are copied, the write performance for these data items received from the host 2 are further deteriorated than in a case where the garbage collection is not performed.

Figure 23:
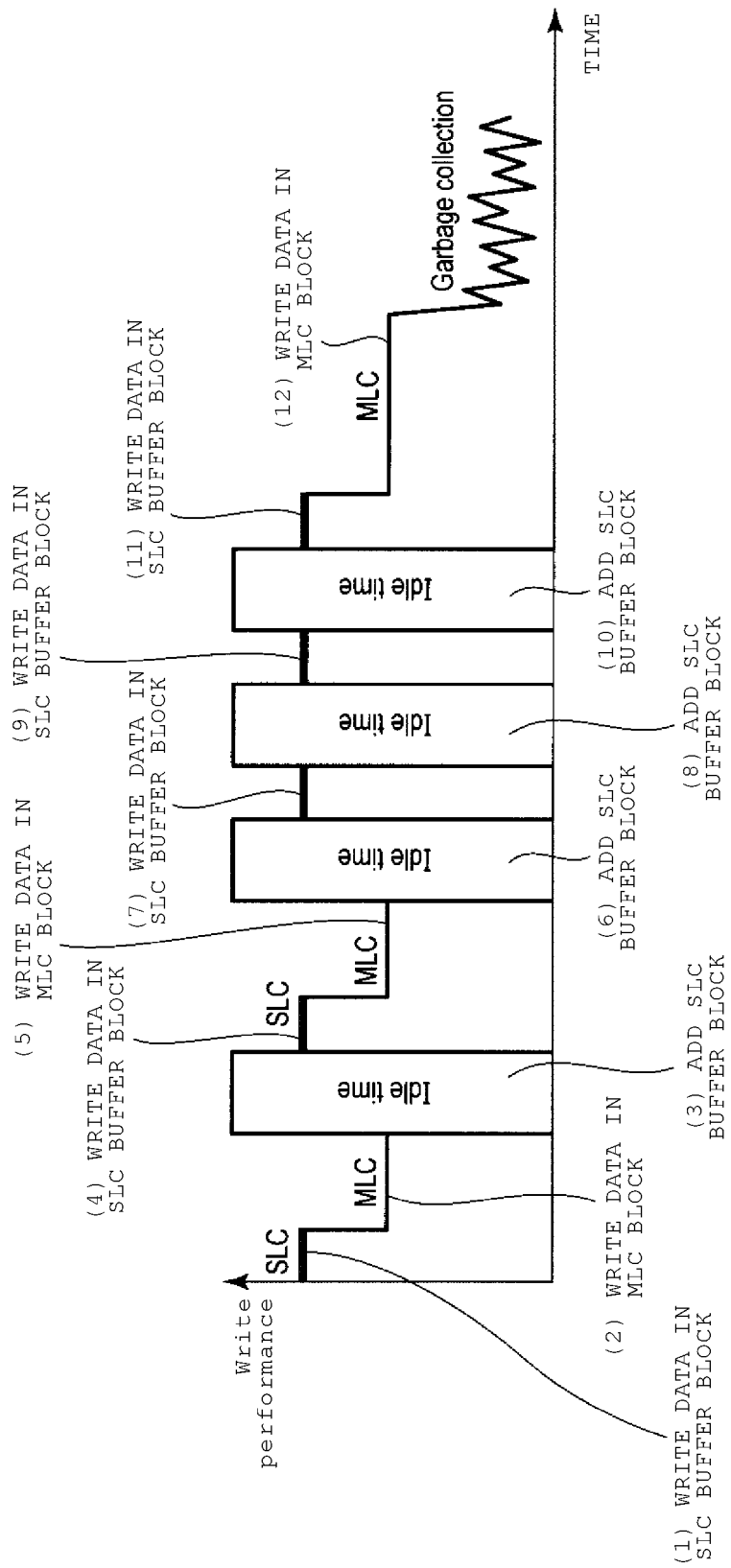
FIG. 23 is a timing chart showing the write operations performed by the memory system according to the present embodiment with the idle states existing therebetween.

A timing chart of FIG. 23 shows the write operations performed by the controller 4 with idle states existing therebetween.

In this example, it is assumed that the allowable data amount is the amount of data items corresponding to one SLC buffer block for simplicity of illustration.

(1) Initially, the write control unit 21 selects the SLC mode as the write mode. The write control unit 21 writes the data items received from the host 2 in the SLC buffer block in the SLC mode. In this case, a write speed in the SLC mode is faster than that in the MLC mode (thus, the write performance in the SLC mode is higher than that in the MLC mode).

(2) When the SLC buffer unit is filled with the data items, that is, when the data items corresponding to the allowable data amount are written in the SLC mode, the write control unit 21 changes the write mode to the MLC mode. The write control unit 21 writes the data items received from the host 2 in the MLC block in the MLC mode. In this case, a write speed in the MLC mode is slower than that in a case where the writing is performed in the SLC mode (thus the write performance in the MLC mode is lower than that in the SLC mode). In contrast, since a rate at which the number of P/E cycles is increased in the MLC mode is lower than that in writing in the SLC mode, it is possible to prevent the lifespan of the SSD 3 from being shortened unlike a case where the writing is continuously performed in the SLC mode.

(3) When a first idle state is detected by the idle state detection unit 22, the write control unit 21 adds the allowable data amount by the amount of data items corresponding to one SLC buffer unit (in this example, the amount of data items corresponding to one SLC buffer block), and returns the write mode to the SLC mode.

(4) The write control unit 21 writes the data items received from the host 2 in the SLC buffer block in the SLC mode after the first idle state is detected.

(5) When the SLC buffer block is filled with the data items, that is, when the amount of data items written in the SLC mode after the first idle state reaches the amount of data items corresponding to one SLC buffer unit (in this example, the amount of data items corresponding to one SLC buffer block), the write control unit 21 changes the write mode to the MLC mode again. The write control unit 21 writes the data items received from the host 2 in the MLC block in the MLC mode.

(6) When a second idle state is detected by the idle state detection unit 22, the write control unit 21 adds the allowable data amount by the amount of data items corresponding to one SLC buffer unit (in this example, the amount of data items corresponding to one SLC buffer block), and returns the write mode to the SLC mode.

(7) The write control unit 21 writes the data items received from the host 2 in the SLC buffer block in the SLC mode after the second idle state is detected.

(8) Before the SLC buffer block that was added when the second idle state is detected is filled with the data items, when the idle state is detected again by the idle state detection unit 22 (referred to herein as the third idle state), the write control unit 21 adds the allowable data amount by the amount of data items corresponding to one SLC buffer unit (in this example, the amount of data items corresponding to one SLC buffer block), and maintains the write mode in the SLC mode.

(9) The write control unit 21 writes the data items received from the host 2 in the SLC buffer block in the SLC mode after the third idle state is detected.

(10) Before the SLC buffer block that was added when the third idle state is detected is filled with the data items, when the idle state is detected again by the idle state detection unit 22 (referred to herein as the fourth idle state), the write control unit 21 adds the allowable data amount by the amount of data items corresponding to one SLC buffer unit (in this example, the amount of data items corresponding to one SLC buffer block), and maintains the write mode in the SLC mode.

(11) The write control unit 21 writes the data items received from the host 2 in the SLC buffer block in the SLC mode after the fourth idle state is detected.

(12) When the SLC buffer block that was added when the fourth idle state is detected is filled with the data items, the write control unit 21 changes the write mode to the MLC mode. The write control unit 21 writes the data items received from the host 2 in the MLC block in the MLC mode. In this case, a write speed in the MLC mode is slower than that in a case where the writing is performed in the SLC mode (thus, the write performance in the MLC mode is lower than that in the SLC mode). In contrast, since a rate at which the number of P/E cycles is increased in the MLC mode is lower than that in writing in the SLC mode, it is possible to prevent the lifespan of the SSD 3 from being shortened unlike a case where the writing is continuously performed in the SLC mode.

When the data items are continuously written with no change in the write mode, the number of remaining free blocks is decreased up to a certain threshold. In doing so, the garbage collection control unit 24 performs the garbage collection in order to increase the number of free blocks. When the garbage collection is performed, since the data items are copied, the write performance for these data items received from the host 2 are further deteriorated than in a case where the garbage collection is not performed.

As stated above, since the allowable data amount is added by the amount of data items corresponding to one SLC buffer unit whenever the idle state is detected, it is possible to perform the write operation immediately after the idle state in the SLC mode. As a result, it is possible to improve the write performance immediately after the detected idle state whenever the idle state is detected. The amount of data items capable of being written in the SLC mode immediately after the idle state is restricted up to the added data amount. Accordingly, it is possible to restrict the number of SLC buffer blocks capable of being used for writing the data items up to the number of blocks corresponding to the amount of added data items, and thus, it is possible to prevent the total number of program/erase cycles from being remarkably increased.

Figure 24:
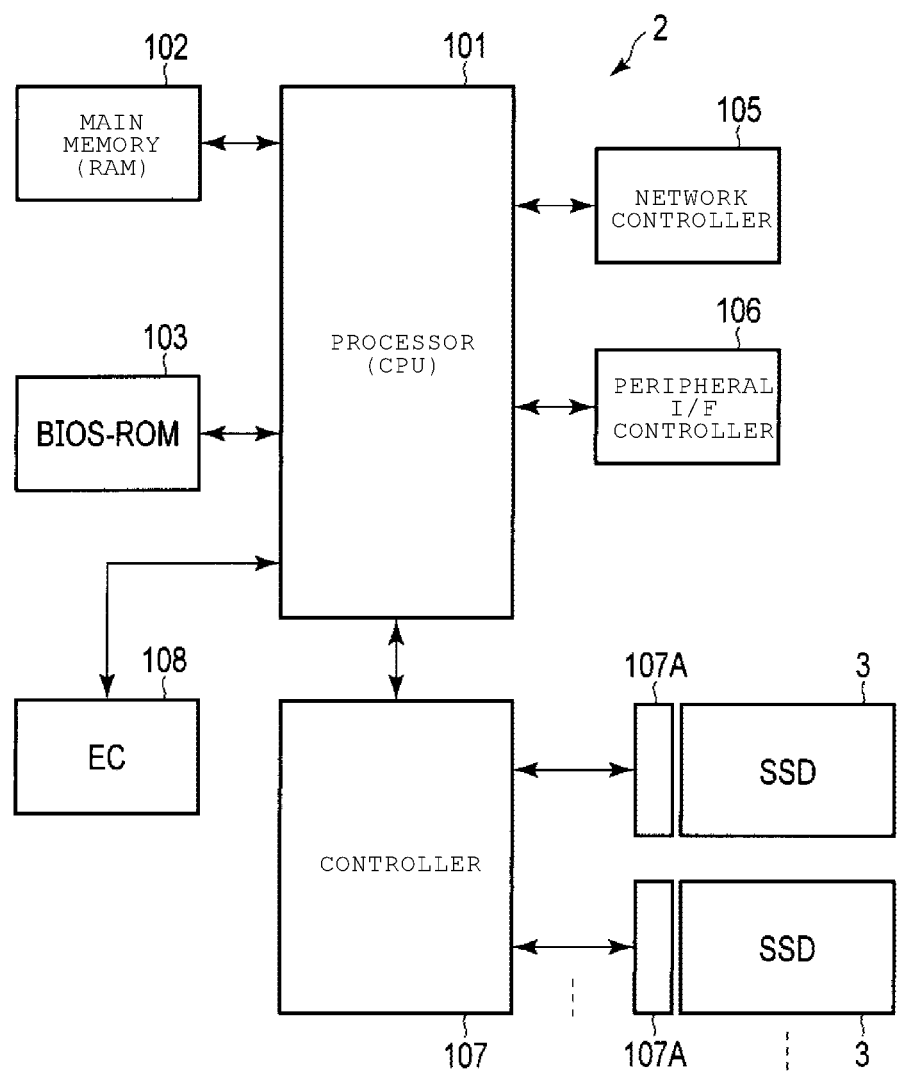
FIG. 24 is a block diagram showing a configuration example of a host.

FIG. 24 shows an example of a hardware configuration of the information processing device (e.g., computing device) functioning as the host 2.

The information processing device is realized as a computing device such as a server. The information processing device includes a processor (CPU) 101, a main memory 102, a BIOS-ROM 103, a network controller 105, a peripheral interface controller 106, a controller 107, and an embedded controller (EC) 108.

The processor 101 is a CPU configured to control operations of components of the information processing device. The processor 101 executes various programs loaded to the main memory 102 from any one of the plurality of SSDs 3. The main memory 102 is a random-access memory such as a DRAM. The processor 101 executes a basic input and output system (BIOS) stored in the BIOS-ROM 103 which is a non-volatile memory. BIOS is a system program for hardware control.

The network controller 105 is a communication device such as a wired LAN controller or a wireless LAN controller. The peripheral interface controller 106 is configured to perform communication with a peripheral device such as a USB device.

The controller 107 is configured to perform communication with devices connected to a plurality of connectors 107A. The plurality of SSDs 3 may be connected to the plurality of connectors 107A, respectively. The controller 107 is a SAS expander, a PCIe switch, a PCIe expander, a flash array controller, or a RAID controller.

The EC 108 functions as a system controller configured to perform power management of the information processing device.

Figure 25:
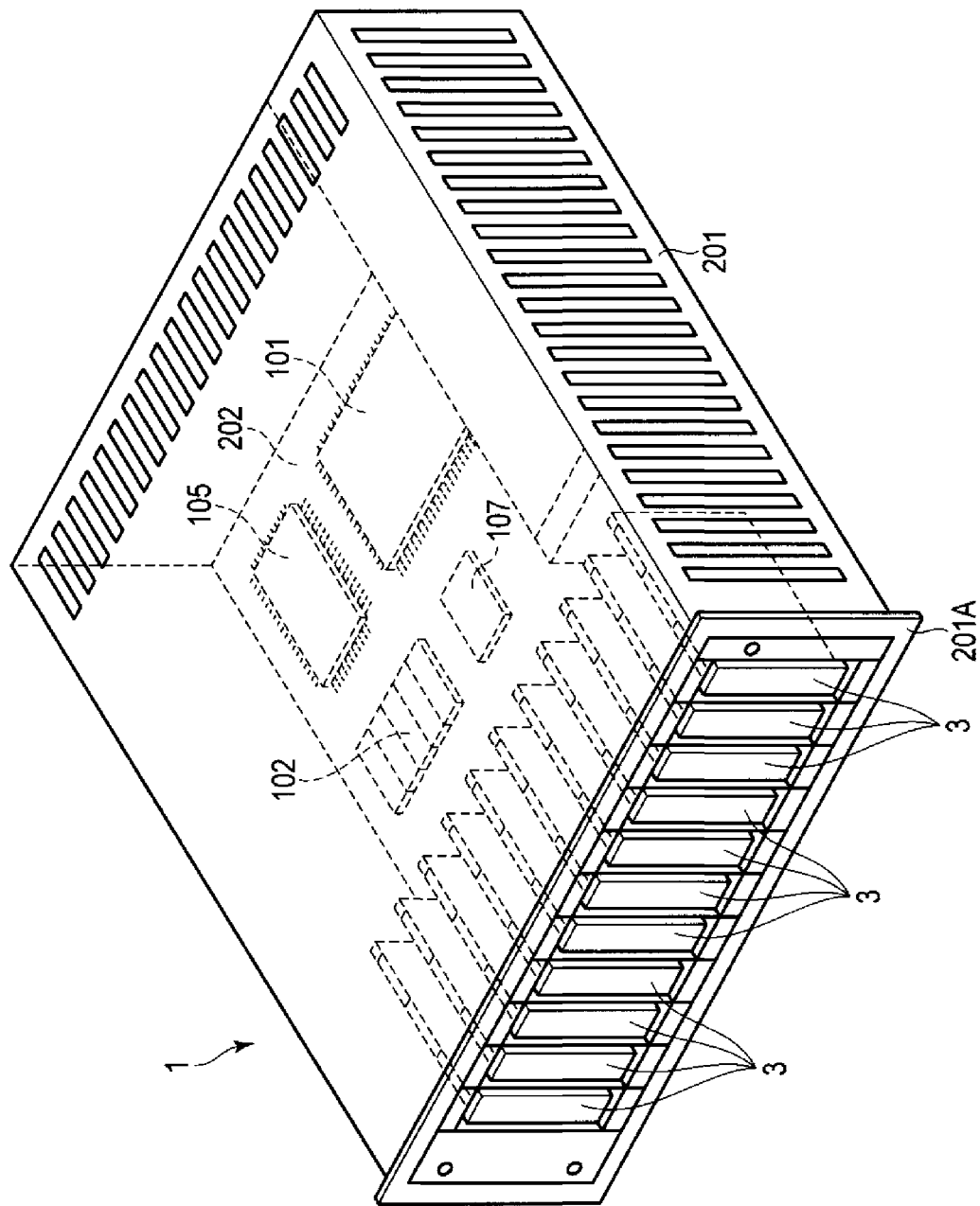
FIG. 25 is a diagram showing a configuration example of a computer including the host and the memory system according to the present embodiment.

FIG. 25 shows a configuration example of the information processing device (e.g., server) including the plurality of SSDs 3 and the host 2.

The information processing device includes a thin box-shaped casing 201 capable of being accommodated in a rack. The plurality of SSDs 3 may be disposed in the casing 201. In this case, each SSD 3 may be detachably inserted into a slot provided in a front surface 201A of the casing 201.

A system board (e.g., motherboard) 202 is disposed within the casing 201. Various electronic components including the CPU 101, the memory 102, the network controller 105, and the controller 107 are mounted on the system board 202. These electronic components function as the host 2.

As described above, according to the present embodiment, the SLC mode is selected as the write mode, and the data items are written in the NAND flash memory 5 in the SLC mode according to a write command received from the host 2 until the amount of data items written in the NAND flash memory 5 reaches the allowable data amount corresponding to the minimum SLC buffer unit.

When the amount of data items written in the NAND flash memory 5 reaches the allowable data amount, the write mode is changed to the MLC mode, and the data items are written in the NAND flash memory 5 in the MLC mode according to a write command received from the host 2. When the idle state in which a command is not received from the host 2 for a period of the interval time or more, the allowable data amount is increased by the amount of data items corresponding to the SLC buffer unit in order to return the write mode to the SLC mode.

The data items are written in the NAND flash memory 5 in the SLC mode according to a write command received from the host 2 after the idle state is detected until the amount of data items written in the NAND flash memory 5 after the idle state reaches the first data amount.

Accordingly, it is possible to improve the write performance immediately after the idle state is detected. The amount of data items capable of being written in the SLC mode immediately after the idle state is restricted up to the amount of added data items. Accordingly, even though the amount of write data items starts to be increased, since it is possible to restrict the amount of data items written in the SLC mode up to the added first data amount, it is possible to prevent the total number of program/erase cycles of the NAND flash memory 5 from being remarkably increased. Thus, it is possible to maintain the balance between the lifespan and performance of the SSD 3.

In the present embodiment, it is determined whether or not a condition for giving permission to increase the allowable data amount is satisfied whenever the idle state is detected. As the condition for giving permission to increase the allowable data amount, a condition that the allowable data amount to be increased is less than the maximum amount of data items capable of being written in the SLC mode and a condition that the current number of P/E cycles of the NAND flash memory 5 (the total number of P/E cycles, the maximum total number of P/E cycles, the minimum number of P/E cycles, or the average number of P/E cycles) is equal to or less than the corresponding threshold may be used. Alternatively, these conditions may be appropriately combined. When the condition for giving permission to increase the allowable data amount is satisfied, the allowable data amount is increased by the first data amount in order to return the write mode to the SLC mode, and the data items corresponding to the first data amount received from the host 2 are written in the NAND flash memory 5 in the SLC mode. Meanwhile, when the condition for giving permission to increase the allowable data amount is not satisfied, the write mode is maintained in the MLC mode.

Accordingly, it is possible to optimize a ratio between the SLC mode and the MLC mode, and it is possible to prevent the lifespan of the SSD 3 to be remarkably shortened by excessively increasing the amount of data items capable of being written in the SLC mode.

In the present embodiment, the NAND flash memory is used as the example of the non-volatile memory. However, the function of the present embodiment may be applied to other various non-volatile memories such as a magnetoresistive random-access memory (MRAM), a phase change random access memory (PRAM), a resistive random access memory (ReRAM), and a ferroelectric random access memory (FeRAM).

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A memory system connectable to a host, the memory system comprising:
    a nonvolatile memory including a plurality of memory cells; and
    a controller electrically connected to the nonvolatile memory and configured to:
        select a first region of the nonvolatile memory as a destination for writing data received from the host, the first region being a region in which n-bit data is to be written per memory cell, where n>0; and
        upon determining that no available space is remaining in the first region, changing the destination for writing data received from the host to a second region of the nonvolatile memory, the second region being a region in which m-bit data is to be written per memory cell, m being greater than n, wherein the controller is configured to, when an idle state has continued for a threshold period or more, increase a size of the first region, the idle state being a state in which no command is received from the host.

2. The memory system according to claim 1, wherein the controller is further configured to:

determine whether the idle state has continued for the threshold period or more; and upon determining that the idle state has continued for the threshold period or more, increase the size of the first region.

3. The memory system according to claim 1, wherein the controller is configured to, in a case where both the first region and the second region include an available space to write data received from the host, write the data received from the host to the first region, and not to the second region.

4. The memory system according to claim 1, wherein the controller is configured to, in a case where the second region includes an available space to write data received from the host but the first region includes no available space to write the data received from the host, write the data received from the host to the second region.

5. The memory system according to claim 1, wherein the controller includes a counter to manage the size of the first region, and the controller is further configured to, non-volatilize the value of the counter into the nonvolatile memory, and read the value from the nonvolatile memory to restore the counter.

6. The memory system according to claim 1, wherein the nonvolatile memory includes a plurality of blocks, each of the plurality of blocks being a unit for an erase operation on the nonvolatile memory, and the controller is further configured to (A) copy first data from a first block in the first region to a second block in the first region, (B) copy second data from a third block in the first region to a fourth block in the second region, (C) copy third data from a fifth block in the second region to a sixth block in the first region, or (D) copy fourth data from a seventh block in the second region to an eighth block in the second region.

7. The memory system according to claim 1, wherein the nonvolatile memory includes a plurality of blocks, each of the plurality of blocks being a unit for an erase operation on the nonvolatile memory, and the controller is further configured to increase the size of the first region when (A) a total of the numbers of erase operations performed on each of the plurality of blocks is less than a first threshold, (B) a maximum of the numbers of erase operations performed on each of the plurality of blocks is less than a second threshold, or (C) an average of the numbers of erase operations performed on each of the plurality of blocks is less than a third threshold.

8. The memory system according to claim 1, wherein the controller is configured to increase the size of the first region when a total amount of data that have been written to the first region is less than a threshold.

9. The memory system according to claim 1, wherein the first region operates as a single-level-cell (SLC) buffer in which 1-bit data is to be written per memory cell.

10. A method of controlling a nonvolatile memory in a memory system, the nonvolatile memory including a plurality of memory cells, said method comprising:

selecting a first region of the nonvolatile memory as a destination for writing data received from a host, the first region being a region in which n-bit data is to be written per memory cell, where n>0;

upon determining that no available space is remaining in the first region, changing the destination for writing data received from the host to a second region of the nonvolatile memory, the second region being a region in which m-bit data is to be written per memory cell, m being greater than n; and when an idle state has continued for a threshold period or more, increasing a size of the first region, the idle state being a state in which no command is received from the host.

11. The method according to claim 10, further comprising:

determining whether the idle state has continued for the threshold period or more; and upon determining that the idle state has continued for the threshold period or more, increasing the size of the first region.

12. The method according to claim 10, wherein, in a case where both the first region and the second region include an available space to write data received from the host, the data received from the host is written to the first region, and not to the second region.

13. The method according to claim 10, wherein, in a case where the second region includes an available space to write data received from the host but the first region includes no available space to write the data received from the host, the data received from the host is written to the second region.

14. The method according to claim 10, further comprising:

using a counter to manage the size of the first region;

non-volatilizing the value of the counter into the nonvolatile memory; and reading the value from the nonvolatile memory to restore the counter.

15. The method according to claim 10, wherein the nonvolatile memory includes a plurality of blocks, each of the plurality of blocks being a unit for an erase operation on the nonvolatile memory, and the method further comprises:

(A) copying first data from a first block in the first region to a second block in the first region, (B) copying second data from a third block in the first region to a fourth block in the second region, (C) copying third data from a fifth block in the second region to a sixth block in the first region, or (D) copying fourth data from a seventh block in the second region to an eighth block in the second region.

16. The method according to claim 10, wherein the nonvolatile memory includes a plurality of blocks, each of the plurality of blocks being a unit for an erase operation on the nonvolatile memory, and the first region is increased when (A) a total of the numbers of erase operations performed on each of the plurality of blocks is less than a first threshold, (B) a maximum of the numbers of erase operations performed on each of the plurality of blocks is less than a second threshold, or (C) an average of the numbers of erase operations performed on each of the plurality of blocks is less than a third threshold.

17. The method according to claim 10, wherein
the size of the first region is increased when a total amount of data that have been written to the first region is less than a threshold.

18. The method according to claim 10, wherein
the first region operates as a single-level-cell (SLC) buffer in which 1-bit data is to be written per memory cell.

19. The memory system according to claim 1, wherein the controller is further configured to:
after increasing the size of the first region, re-change the destination for writing data received from the host to the first region.

20. The method according to claim 10, further comprising:
after increasing the size of the first region, re-changing the destination for writing data received from the host to the first region.

\* \* \* \* \*